(12) United States Patent
Kawasaki et al.

(10) Patent No.: US 11,377,715 B2
(45) Date of Patent: Jul. 5, 2022

(54) SOLDER ALLOY, SOLDER PASTE, SOLDER BALL, SOLDER PREFORM, SOLDER JOINT, AND CIRCUIT

(71) Applicant: SENJU METAL INDUSTRY CO., LTD., Tokyo (JP)

(72) Inventors: Hiroyoshi Kawasaki, Tokyo (JP); Masato Shiratori, Tokyo (JP); Yuji Kawamata, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 17/603,419

(22) PCT Filed: May 15, 2020

(86) PCT No.: PCT/JP2020/019502
§ 371 (c)(1),
(2) Date: Oct. 13, 2021

(87) PCT Pub. No.: WO2020/241318
PCT Pub. Date: Dec. 3, 2020

(65) Prior Publication Data
US 2022/0090232 A1 Mar. 24, 2022

(30) Foreign Application Priority Data
May 27, 2019 (JP) .............. JP2019-098950

(51) Int. Cl.
*C22C 13/02* (2006.01)
*B23K 35/26* (2006.01)
(Continued)

(52) U.S. Cl.
CPC .......... *C22C 13/02* (2013.01); *B23K 1/0016* (2013.01); *B23K 35/262* (2013.01); *B23K 2101/42* (2018.08)

(58) Field of Classification Search
None
See application file for complete search history.

(56) References Cited

U.S. PATENT DOCUMENTS

2016/0271738 A1* 9/2016 Murphy .................. B23K 1/00

FOREIGN PATENT DOCUMENTS

| CN | 104395035 | 3/2015 |
| CN | 106794557 | 5/2017 |

(Continued)

OTHER PUBLICATIONS

International Search Report for PCT/JP2020/019502, dated Aug. 4, 2020, 4 pages.

(Continued)

*Primary Examiner* — Devang R Patel
(74) *Attorney, Agent, or Firm* — Nixon Peabody LLP; Jeffrey L. Costellia

(57) ABSTRACT

Provided are a solder alloy, which has excellent heat cycle characteristics and in which Cu erosion and yellowish discoloration are suppressed, and an increase in viscosity of a solder paste over time is suppressed, a solder paste, a solder ball, a solder preform, a solder joint, and a circuit. The solder alloy has an alloy composition consisting of, by mass %, 2.8% to 4% of Ag, 1.5% to 6% of Bi, 0.8% to 1.2% of Cu, 0.0040% to 0.025% of As, and a balance of Sn.

16 Claims, 2 Drawing Sheets

(51) Int. Cl.
*B23K 1/00* (2006.01)
*B23K 101/42* (2006.01)

(56) References Cited

FOREIGN PATENT DOCUMENTS

| | | | | |
|---|---|---|---|---|
| CN | 107427969 | 12/2017 | | |
| JP | 05-228685 | 9/1993 | | |
| JP | 09-326554 | 12/1997 | | |
| JP | 2000-349433 | 12/2000 | | |
| JP | 2002-224881 | 8/2002 | | |
| JP | 2002224881 A * | 8/2002 | ............ | B23K 35/26 |
| JP | 2014-024082 | 2/2014 | | |
| JP | 2015-098052 | 5/2015 | | |
| JP | 2015098052 A * | 5/2015 | ............ | B23K 35/26 |
| JP | 5807733 | 11/2015 | | |
| JP | 2016-537206 | 12/2016 | | |
| WO | WO-2015/066155 | 5/2015 | | |
| WO | WO-2015066155 A1 * | 5/2015 | ........... | B23K 35/025 |
| WO | WO-2019/103025 | 5/2019 | | |

OTHER PUBLICATIONS

Chinese Search Report (Application No. 202080014645.4) dated Feb. 8, 2022 (total 8 pages).

* cited by examiner

SOLDER ALLOY, SOLDER PASTE, SOLDER BALL, SOLDER PREFORM, SOLDER JOINT, AND CIRCUIT

TECHNICAL FIELD

The present invention relates to a solder alloy, a solder paste, a solder ball, a solder preform, a solder joint, and a circuit.

BACKGROUND ART

In the related art, a solder alloy widely used in so-called "consumer electronic devices" such as televisions, videos, mobile phones, and personal computers is an Sn-3Ag-0.5Cu solder alloy. Such a solder alloy is used without problems in improving fluxes or soldering devices, and there is no problem of peeling-off in normal use of consumer electronic devices during a service life period therewith.

Regarding consumer electronic devices, a heat cycle test is employed as a durability test for solder joints therein. In a heat cycle test which is often employed in consumer electronic devices, a chip resistor component having a size of 3.2×1.6×0.6 (mm) is soldered onto a printed substrate, and 500 cycles of heating and cooling of the solder joint are repeated at temperatures of −40° C. and +85° C. for 30 minutes each. Thereafter, the conduction state between conductors is measured, and if the conductors are energized, they are determined to be acceptable.

Incidentally, electronic circuits (hereinafter, referred to as "in-vehicle electronic circuits") obtained by soldering, that is, mounting electronic components on printed circuit boards are also mounted on vehicles, and such in-vehicle electronic circuits are also subjected to heat cycle tests. Heat cycle tests which are employed in in-vehicle electronic circuits and will be described below are performed under very severe conditions that are not considered for heat cycle tests for the above-described consumer electronic devices. Many solder alloys having excellent heat cycle characteristics have been proposed as shown in, for example, Patent Literature 1 to 3.

In addition, since the above-described solder alloy contains Sn as a main component, if the surface of the solder alloy is oxidized, an SnO coating film, which is an oxide film, is formed, and the surface thereof turns yellow. The thicker the film thickness of the SnO coating film, the greater the yellowness of the surface of the solder. If the surface of a solder alloy turns yellow and loses its metallic luster, the solder alloy is not detected during automatic processing of image recognition of the solder alloy. Therefore, in some cases, a solder alloy that actually exists is not recognized.

Regarding solder materials of which yellowish discoloration of surfaces thereof is suppressed in the related art, Patent Literature 4 discloses, for example, a solder material, which is a sphere having a diameter of 1 to 1,000 µm, including: a solder layer consisting of a metallic material made of an alloy containing 40 mass % or more of Sn or a metallic material containing 100 mass % of Sn; and a coating layer that covers the surface of the solder layer, in which, in the coating layer, an SnO film is formed outside the solder layer and an $SnO_2$ film is formed outside the SnO film, and the thickness of the coating layer is greater than 0 nm and less than or equal to 4.5 nm. In the solder material, yellowish discoloration of the surface of the solder material is suppressed through formation of an $SnO_2$ film.

CITATION LIST

Patent Literature

[Patent Literature 1]
    Japanese Unexamined Patent Application, First Publication No. H5-228685
[Patent Literature 2]
    Japanese Unexamined Patent Application, First Publication No. H9-326554
[Patent Literature 3]
    Japanese Unexamined Patent Application, First Publication No. 2000-349433
[Patent Literature 4]
    Japanese Patent No. 5807733

SUMMARY OF INVENTION

Technical Problem

However, the solder alloys disclosed in Patent Literature 1 to 3 do not show sufficient heat cycle characteristics when heat cycle tests currently required for solder joints of in-vehicle electronic circuits are performed. When heat cycle tests in which 1,500 cycles of a heat cycle from −55° C. to +125° C., which is a condition more severe than that of heat cycle tests employed in the above-described consumer electronic devices, were actually performed, satisfactory results were not obtained.

For example, the heat cycle characteristics of a solder alloy cannot be evaluated in currently performed bulk tests, for example, tensile strength tests, creep tests, and fatigue tests. It is said that, in order to evaluate the heat cycle characteristics of a solder joint, it is appropriate to perform a heat cycle test for a printed substrate on which components are actually mounted. In particular, in-vehicle electronic circuits are required to have a predetermined shear strength in very severe heat cycle tests in which a heating and cooling cycle from −55° C. to +125° C. is performed over at least 1,500 cycles, more preferably 3,000 cycles. However, such criteria could not be satisfied in the solder alloys in the related art.

Incidentally, in-vehicle electronic circuits are used in devices that electrically control engines, power steering, brakes, and the like and are very important safety components for driving vehicles. For this reason, in-vehicle electronic circuits need to be able to operate stably without failure for a long period of time. In particular, an in-vehicle electronic circuit for engine control is installed near an engine, and therefore, a usage environment thereof is quite severe. The temperature near an engine where such an in-vehicle electronic circuit is installed becomes as high as 100° C. or higher when the engine rotates and becomes as low as −30° C. or lower when the engine is stopped in winter in cold regions. Accordingly, an in-vehicle electronic circuit is exposed to a heat cycle from −30° C. to +100° C. due to repetition of rotation and stopping of an engine.

If an in-vehicle electronic circuit is exposed to such an environment (hereinafter, referred to as a heat cycle environment) where the temperature changes significantly over a long period of time, a solder and a printed substrate respectively cause thermal expansion and contraction. However, since the coefficient of thermal expansion differs between a solder alloy, which is a metal, and a printed substrate made of a resin, stress is applied to both of them. At this time, this does not cause a problem because the printed substrate made of a resin expands. However, the expansion and contraction over a long period of time may cause metal fatigue on the solder alloy which is a metal, and in some cases, the solder alloy may crack and break after the elapse of a long period of time.

That is, since metal fatigue is caused due to stress over a long period of time, even if there are no problems for a while after the start of use of a new vehicle, it is thought that the solder alloy of solder joints of in-vehicle electronic circuits will peel off when the vehicle runs for a long period of time. The reason for this is that, the shear strength of solder joints is weakened in a heat cycle environment to the extent of the solder joints not breaking, and the solder joints may peel off due to a large impact received from the road surface or continuous small vibration received from the engine.

Accordingly, solder alloys used in in-vehicle electronic circuits are required to exhibit excellent heat cycle characteristics in a heat cycle environment. Here, it might be thought preferable to use Sn-3Ag-0.5Cu solder alloys already used in consumer electronic devices for soldering in-vehicle electronic circuits. However, since such solder alloys do not have sufficient heat cycle characteristics for severe heat cycle environments, they are unlikely to be able to be used in severe heat cycle environments such as vehicles where the difference between a high temperature and a low temperature is very large.

In addition, in usual soldering, a solder alloy constituting a solder joint melts a plurality of times, and in a correction process, the temperature of the solder joint becomes higher than the usual soldering temperature. For this reason, so-called Cu erosion occurs in which the Cu of a substrate or a component dissolves. In particular, in the above-described solder alloy containing Sn as a main component, Cu dissolves quickly and the Cu of a substrate or a component is eroded.

Furthermore, in addition to the heat cycle characteristics or the Cu erosion, the effect of suppressing the yellowish discoloration of the surface of solder alloys is an important factor in the automatic processing of image recognition of solder alloys. However, since the solder material disclosed in Patent Literature 4 needs to form an $SnO_2$ film, high-energy plasma irradiation or the like is required, which complicates the production process.

In addition, in joining and assembling of electronic components to substrates of electronic devices, soldering using a solder paste is advantageous in terms of costs and reliability. Coating of a substrate with a solder paste is performed, for example, through screen printing using a metal mask. In order to secure printability of a solder paste, it is necessary for the viscosity of the solder paste to be appropriate.

Here, in a case where a solder powder in which yellowish discoloration is suppressed is used, it is possible to increase the content of an activator used in a solder paste or to use a highly active one in order to improve the wettability. However, if the wettability is improved with an activator or the like, the viscosity of a solder paste increases over time. For this reason, in the solder alloy in the related art, it is impossible to simultaneously have a required thickening suppression effect when used in a solder paste in addition to effects regarding heat cycle characteristics and suppressing yellowish discoloration, and further research thereon is required.

Here, an object of the present invention is to provide a solder alloy, which has excellent heat cycle characteristics and in which Cu erosion and yellowish discoloration are suppressed, and an increase in viscosity of a solder paste over time is suppressed, a solder paste, a solder ball, a solder preform, a solder joint, and a circuit.

Solution to Problem

The present inventors have found that, in the solder alloys having excellent heat cycle characteristics in the related art, higher reliability for in-vehicle electronic circuits cannot be satisfied and further improvement is required. Accordingly, the present inventors used printed circuit boards on which electronic components were mounted to actually measure the shear strength of solder alloys having various compositions and structures between electronic components and substrates after heat cycle tests. As a result, it was found that solder alloys having a specific composition, particularly alloys having a precipitation-recoverable solid solution structure were effective for suppressing deterioration in shear strength due to heat cycle tests.

That is, the present invention relates to an Sn—Ag—Cu solder alloy containing a solid solution element, the solder alloy having: an alloy structure consisting of a supersaturated solid solution or a solid solution in which a solid solution element precipitates at room temperature; and an alloy structure consisting of a solid solution in which the solid solution element precipitated at a low temperature redissolves in an Sn matrix at a high temperature in a heat cycle environment.

According to the present invention, the shear strength of the solder alloy being used in a heat cycle environment can be significantly improved.

In the present specification, the above-described alloy structures included in the alloy of the present invention are comprehensively called "precipitate-recoverable solid solution structures" including cases of at high temperatures and room temperatures and a case of alloy structures consisting of solid solutions or supersaturated solid solutions.

FIG. 1 is an explanatory view of structural change of the alloy according to the present invention due to temperature change in high- and low-temperature environments. At a high temperature at which a sufficient solid solution limit can be secured, Bi dissolves in an Sn matrix to form a solid solution. However, on the state diagram, if the solid solution is cooled, Bi precipitates, precipitates of elements, such as Bi, dissolving in Sn in a large amount easily become coarsened, and Bi itself contributes little to the mechanical properties of Sn.

However, in the present invention, it has been found that, in heat cycle tests with the repeated load from low- and high-temperature environments over a limited period of time, Bi which temporarily dissolves in Sn at a high temperature does not form coarse precipitates even during cooling and is present in Sn as a supersaturated solid solution or fine precipitates from a supersaturated solid solution which cannot be observed with a scanning electron microscope. However, if the content of Bi is low, Bi cannot be present as a supersaturated solid solution or fine precipitates from a supersaturated solid solution at room temperature. Therefore, development of cracks in heat cycle tests cannot be inhibited. On the other hand, if the content of Bi is too high, in some cases, cracks develop too quickly due to segregation of Bi at an initial stage of solidification. In the case of the present invention, the alloy composition is adjusted such that Bi is incorporated at a proportion at which Bi is supersaturated at room temperature at all times. Therefore, Bi becomes a supersaturated solid solution as soon as the heat cycle environment enters a cooling stage.

It was unexpected that the above-described "precipitate-recoverable solid solution structure" would be exhibited in a heat cycle in which the temperature is held at each of −55° C. and +125° C. for 30 minutes. Since the equilibrium state is always considered in the state diagram, it can be predicted that the coarsening of Bi will progress in all solder alloys having the alloy composition according to the present invention in a room- or low-temperature environment. However, it was unexpected that the coarsening of Bi could be suppressed even after a heat cycle of heating for 30 minutes and cooling for 30 minutes was repeated 1,500 to 3,000 cycles as described above, and that Bi would continue to exist in Sn as a supersaturated solid solution or fine precipitates from a supersaturated solid solution. Moreover, it was also completely unexpected that excellent effects that had never been considered before would be exhibited because of that.

Furthermore, it was also unexpected that Bi would be able to be dispersed in Sn as a supersaturated solid solution or fine precipitates from a supersaturated solid solution even at room temperature by subjecting coarse Bi at an initial stage of solidification to a heat cycle test with 500 cycles from −55° C. to +125° C. for 30 minutes each, and that the reliability of a solder joint would be improved by applying a thermal load such as these heat cycles.

Here, precipitation of Bi from a supersaturated solid solution in the present invention has an effect different from that of segregation of coarse Bi due to segregation during solidification. In the former case, the mechanical strength improves due to the presence of uniformly fine Bi in an Sn matrix as a supersaturated solid solution or fine precipitates from a supersaturated solid solution. On the other hand, in the latter case, since Bi which is a solid solution element is coarsely segregated between the final solidification part, a grain boundary, and a dendrite arm, effects of inhibiting the movement of dislocations to improve the strength cannot be expected. Such a "solidification segregation type alloy structure" is clearly distinguished from the above-described "precipitate-recoverable solid solution structure" also in terms of formation mechanisms, metallurgical structures, and effects thereof.

In other words, in the present invention, it is necessary to prepare a solder alloy so that such segregation of Bi does not occur. Specifically, the content of Bi is adjusted, or rapid solidification is performed at the time of preparing an alloy. Alternatively, rapid solidification of molten solder during soldering is performed, or molten solder is used for mounting on a substrate such as a power device having a large thermal load and heat treatment is performed during conduction. In addition, means such as subjecting components having a small thermal load to heat treatment at 125° C. for 50 to 300 hours to improve coarse Bi produced by solidification segregation to a supersaturated solid solution or fine precipitates from a supersaturated solid solution is preferable. Furthermore, it is preferable to exclude the growth of dendrite crystals.

Furthermore, the present inventors have found that the reliability of alloys near an Sn—Ag—Cu eutectic point changes depending on the content of Cu. That is, it has been found that the reliability of a solder alloy improves when the content of Cu is greater than or equal to 0.8 mass %. Along with this, it has been confirmed that the heat cycle characteristics required for in-vehicle electronic circuits on which electronic components are mounted are satisfied with the coexistence of a predetermined amount of Cu with Bi.

The "heat cycle characteristics required for in-vehicle electronic circuits" referred to in the present specification means that the in-vehicle electronic circuit can be stably used for a long period of time even in the heat cycle environment usually experienced when using vehicles. Specifically, the heat cycle characteristics refer to characteristics that penetration of cracks into a solder joint even after the elapse of 1,500 cycles when a heat cycle test in which the solder joint is held at each of temperatures of −55° C. and +125° C. for 30 minutes is performed.

In this manner, according to the precipitate-recoverable solid solution structure of the present invention, it is inferred that the shear strength after heat cycles would be improved due to the following reason. If a solid solution is cooled, solid solution hardening to such a degree that solid solution elements in excess of the solid solution limit in a matrix cannot be obtained from ordinary solid solutions from a supersaturated solid solution or precipitation strengthening in which elements finely precipitate from a supersaturated solid solution is exhibited. As a result, the shear strength after heat cycling improves. The reason why the shear strength improves is the same as that for the strength improvement effect due to precipitation of intermetallic compounds. However, intermetallic compounds change from fine acicular crystalline compounds to bulky crystalline compounds as heat cycling progresses, and therefore, the strength improvement effect significantly decreases.

However, in the supersaturated solid solution or Bi precipitating from the supersaturated solid solution in the above-described "precipitate-recoverable solid solution structure", solid solution elements re-dissolve at a high temperature in the heat cycle environment. On the other hand, Bi precipitates in an Sn matrix again at room temperature or low temperatures as a supersaturated solid solution or Bi finely precipitating from a supersaturated solid solution. Therefore, according to the above-described precipitate-recoverable solid solution structure, the strength improvement effect due to a supersaturated solid solution or Bi precipitating from a supersaturated solid solution can be expected regardless of the progress of thermal fatigue. That is, since the structure of a supersaturated solid solution or Bi precipitating from a supersaturated solid solution is repeatedly recovered during use in a heat cycle environment, the strength improvement effect is semi-permanently maintained. Accordingly, the deterioration in shear strength in a heat cycle environment can be inhibited, and the heat cycle characteristics can be improved.

When the content of Cu is 1.5 mass %, satisfactory heat cycle characteristics for in-vehicle electronic circuits can be obtained even if there is no Bi. However, since the liquidus temperature exceeds 250° C., it is difficult to mount components. In the present invention, in solder alloys for usual printed circuit boards, the upper limit of the content of Cu is 1.2 mass %. The upper limit thereof is preferably less than or equal to 1.0 mass %.

In general, if there are intermetallic compounds in a matrix of a solder alloy, it is said that the heat cycle characteristics improve. The present inventors have conducted extensive studies on the heat cycle characteristics of a solder alloy in which intermetallic compounds are present, and as a result, they have found that the heat cycle characteristics greatly depend on the shape, size, or distribution condition of the intermetallic compounds. For example, if intermetallic compounds are acicular crystals, in a case where cracks occur, these crystals act as if they were reinforcing bars in concrete and inhibit the progress of the cracks. However, if these are continuously used in a heat cycle environment, the acicular crystals become spherical. If the spherical crystals are coarsened to about several μm after that, they do not contribute to the heat cycle characteristics.

In addition, the present inventors have found that, if cracks occur in a solder alloy of a solder joint in a heat cycle environment, intermetallic compounds existing in directions where cracks progress are spheroidized and coarsened due to stress of the cracks. For this reason, the coarsened intermetallic compounds can no longer suppress the progress of cracks.

Here, in a case where a solder alloy containing Sn as a main component contains Ag or Cu, fine acicular crystals of $Ag_3Sn$ or $Cu_6Sn_5$ which are intermetallic compounds formed in an Sn matrix are coarsened and become granular crystals. This mechanism is inferred to be as follows.

$Ag_3Sn$ or $Cu_6Sn_5$ in a fine crystalline state has a significantly large interface area with an Sn matrix, and the sum of interfacial energy significantly increases. On the other hand, since a reaction proceeds from a high energy state to a low energy state in a natural phenomenon, the interface area between $Ag_3Sn$ or $Cu_6Sn_5$ and an Sn matrix decreases. That is, intermetallic compounds change from fine acicular crystals to large spherical crystals. Such coarsening of intermetallic compounds is likely to occur at a high temperature in a heat cycle environment, and if this change progresses, the effect of improving heat cycle characteristics due to intermetallic compounds can no longer be expected. Incidentally, coarsening of intermetallic compounds hardly occurs at a distal portion of a fillet where stress is relatively hard to be applied, and is significant in a solder joint of a bottom portion of a chip component where stress is concentrated. In a case where cracks occur, spheroidization and coarsening of intermetallic compounds occur along directions where cracks progress, and the progress of cracks cannot be stopped in coarsened intermetallic compounds.

On the other hand, if the amount of the above-described intermetallic compounds is small even in the "precipitate-recoverable solid solution structure" according to the present invention, it is difficult to suppress the progress of cracks. For this reason, it is necessary for the volume of a eutectic structure of $Ag_3Sn$ or $Cu_6Sn_5$ and Sn to occupy at least 40% or more, and it is necessary for the content of Ag to be greater than or equal to 2.5% and for the content of Cu to be greater than or equal to 0.8%. It is preferable that the content of Ag be greater than or equal to 2.8% and the content of Cu be greater than or equal to 0.9%.

According to the findings of the present inventors, the effect of Bi in the precipitate-recoverable solid solution structure according to the present invention is as follows.

According to the solid solution in which Bi dissolves, the Bi supersaturated solid solution, and the solid solution containing fine Bi precipitates of the present invention, the heat cycle characteristics of a solder alloy improve in any form. Here, a solid solution is obtained such that solute atoms interrupt a stable position between crystal lattices of a solvent metal or crystal lattice points common to solvent atoms and solute atoms are replaced with each other. In the solder alloy according to the present invention, Bi dissolves in an Sn matrix. Since Sn which is a solvent atom and Bi which is a solute atom have different sizes, they are distorted and hardened. Here, considering the case where Bi precipitates from a supersaturated solid solution, a solder alloy solidifies as a supersaturated solid solution when it completely solidifies. However, as the temperature drops thereafter, Bi that has exceeded the solid solution limit finely precipitates and is hardened due to lattice distortion between the precipitates and the Sn matrix at that time, whereby the heat cycle characteristics improve.

Accordingly, the heat cycle characteristics of the solder alloy in which fine intermetallic compounds are present in an Sn matrix, Bi dissolves in Sn, and Bi precipitates from a supersaturated solid solution are further improved due to synergistic actions thereof.

However, if in-vehicle electronic circuits are exposed to the heat cycle environment as described above, intermetallic compounds in a solder alloy are largely spheroidized, whereby the effect of suppressing cracks due to intermetallic compounds is reduced. Here, if an Sn matrix itself in which Bi dissolves and an Sn matrix in which fine Bi precipitates from a supersaturated solid solution have an effect of improving the heat cycle characteristics, the progress of cracks can be suppressed. Since the effect of suppressing cracks is sufficient until fine intermetallic compounds are coarsened, in order to maintain the effect of suppressing the development of cracks, it is necessary for the volume of a eutectic structure of $Ag_3Sn$ or $Cu_6Sn_5$ and Sn to occupy at least 40% or more. This volume fraction can be realized when the content of Ag is greater than or equal to 2.8% and the content of Cu is greater than or equal to 0.8%. It is preferable that the content of Ag be greater than or equal to 3.0% and the content of Cu be greater than or equal to 0.9%.

In particular, 12 mass % or more Bi dissolves in an Sn matrix at 125° C. For this reason, with the content of Bi in the present invention, Bi becomes a supersaturated solid solution when the temperature returns to room temperature, fine Bi precipitates are present regardless of thermal fatigue, and the strength improvement effect of a solder alloy along with the elapse of heat cycles does not deteriorate unlike the intermetallic compounds such as $Ag_3Sn$ or $Cu_6Sn_5$.

Accordingly, in a case where a product soldered with a solder alloy containing Sn as a main component is placed in a heat cycle environment, if there are intermetallic compounds in a Sn matrix and Bi dissolves therein, excellent heat cycle characteristics are maintained at an initial stage due to synergistic effects thereof. Moreover, even if cracks occur in a solder of a solder joint due to intermetallic compounds which have been left in a heat cycle environment for a long period of time and largely spheroidized, the Sn matrix in which Bi dissolve suppresses the progress of cracks. For this reason, the service life until the solder joint is completely peeled off is extended.

In such a solder alloy in which Bi dissolves in an Sn matrix, excellent heat cycle characteristics can be maintained by Bi dissolving and existing in the Sn matrix and fine Bi precipitates from a supersaturated solid solution even in a significantly severe heat cycle environment, for example, exposure to 1,500 cycles to 3,000 cycles at each of temperatures of −55° C. and +125° C. for 30 minutes, which is not considered for consumer electronic devices. In particular, in some cases, Bi partially coarsely precipitates through solidification segregation at an initial stage of soldering. Even in such a case, if a product soldered with a solder alloy containing Bi is placed in a heat cycle environment, coarsened Bi at the initial stage of the heat cycle environment gradually becomes finer with the elapse of time, and the heat cycle characteristics improve. However, the amount of Bi solidified and segregated is preferably made as small as possible from the beginning.

Furthermore, out of various elements, the present inventors have attempted to intentionally add, as an element of suppressing yellowish discoloration, a trace amount of As to an Sn—Ag—Cu—Bi solder alloy which has excellent heat cycle characteristics as described above and in which Cu erosion is suppressed. The solder alloy containing Sn as a main component is known to form an $SnO_2$ film as described above, and a solder alloy containing As is usually considered to be inferior in wettability. However, unexpectedly, the present inventors have found that, in an Sn—Ag—Cu—Bi—As solder alloy containing As, the heat cycle characteristics are excellent, Cu erosion is suppressed, and yellowish discoloration is suppressed and an excellent thickening suppression effect is obtained through formation of an As-concentrated layer on the surface of the solder alloy, and have completed the present invention.

Here, the present invention is as follows.

(1) A solder alloy having an alloy composition consisting of, by mass %, 2.8% to 4% of Ag, 1.5% to 6% of Bi, 0.8% to 1.2% of Cu, 0.0040% to 0.025% of As, and a balance of Sn, the solder alloy including: an As-concentrated layer, in which the presence of the As-concentrated layer is confirmed by determination criteria as below, the As-concentrated layer is a region from an outermost surface of the solder alloy to a depth of 2×D1 (nm) in terms of $SiO_2$, and a thickness of the As-concentrated layer in terms of $SiO_2$ is 0.5 to 8.0 nm.

Determination Criteria

In a sample having a size of 5.0 mm×5.0 mm, an arbitrary area of 700 μm×300 μm is selected, and an XPS analysis is performed in combination with ion sputtering. One area is selected for each sample, and each of three samples is analyzed once, for a total of three analyses. In a case where S1>S2 in all of the three analyses, it is determined that an As-concentrated layer has been formed.

Here,

S1: Integrated value of a detection intensity of As in a region from a depth of 0 to 2×D1 (nm) in terms of $SiO_2$ in a chart of XPS analysis S2: Integrated value of a detection intensity of As in a region from a depth of 2×D1 to 4×D1 (nm) in terms of $SiO_2$ in a chart of XPS analysis D1: Initial depth (nm) in terms of $SiO_2$ at which a detection intensity of O atoms is ½ a maximum detection intensity (intensity at Do·max) in portion deeper than the depth (Do·max (nm)) in terms of $SiO_2$ at which a detection intensity of O atoms is a maximum in a chart of XPS analysis (2) The solder alloy according to the above-described (1), in which the alloy composition further satisfies Expressions (1) and (2) below.

$$0.39 \leq 1{,}000 \times As/(Ag+Cu+Bi) \leq 0.71 \quad (1)$$

$$0.67 \leq 1{,}000 \times As/Bi \leq 2.67 \quad (2)$$

In Expressions (1) and (2), As, Ag, Cu, and Bi each represent a content (mass %) in the solder alloy.

(3) The solder alloy according to the above-described (1) or (2), further including: a precipitate-recoverable solid solution structure.

(4) The solder alloy according to any one of the above-described (1) to (3), in which the alloy composition further includes, by mass %, at least one of Ni, Fe, and Co in a total amount of 0.005% to 0.05%.

(5) The solder alloy according to any one of the above-described (1) to (4), in which the alloy composition further includes, by mass %, 0.02% to 0.04% of Ni.

(6) The solder alloy according to any one of the above-described (1) to (5), in which the alloy composition further includes, by mass %, at least one of P, Ge, and Ga in a total amount of 0.0002% to 0.02%.

(7) The solder alloy according to any one of the above-described (1) to (6), in which the alloy composition further includes, by mass %, less than or equal to 1% of In.

(8) The solder alloy according to any one of the above-described (1) to (7), in which the alloy composition further includes, by mass %, less than or equal to 1% of Zn.

(9) The solder alloy according to any one of the above-described (1) to (8) which is used in a power module.

(10) A solder paste including: a solder powder consisting of the solder alloy according to any one of the above-described (1) to (9); and a flux.

(11) A solder ball consisting of the solder alloy according to any one of the above-described (1) to (9).

(12) A solder preform consisting of the solder alloy according to any one of the above-described (1) to (9).

(13) A solder joint made of the solder alloy according to any one of the above-described (1) to (9).

(14) A circuit including: the solder joint according to the above-described (13).

In the heat cycle test in the present invention, a cycle of an operation in which a lead-free solder paste is printed and applied to a soldering pattern (1.6×1.2 (mm)) of a printed substrate to a thickness of 150 μm, a 3.2×1.6×0.6 (mm) chip resistor component is placed thereon, soldering is performed in a reflow furnace at a peak temperature of 245° C., and then, the printed substrate on which the chip resistor component is mounted is held at −55° C. to +125° C. for 30 minutes each is performed 1,500 cycles.

Regarding "excellent heat cycle characteristics" in the present invention, heat cycle characteristics are considered to be excellent in a case where an average strength when a chip resistor component on a printed substrate after the above-described heat cycle test is peeled off by applying a force to the chip resistor component in a horizontal direction from the side with a joining strength tester is greater than or equal to 20 newton (N) and the minimum value thereof is greater than or equal to 15 N.

DESCRIPTION OF EMBODIMENTS

Figure 1:
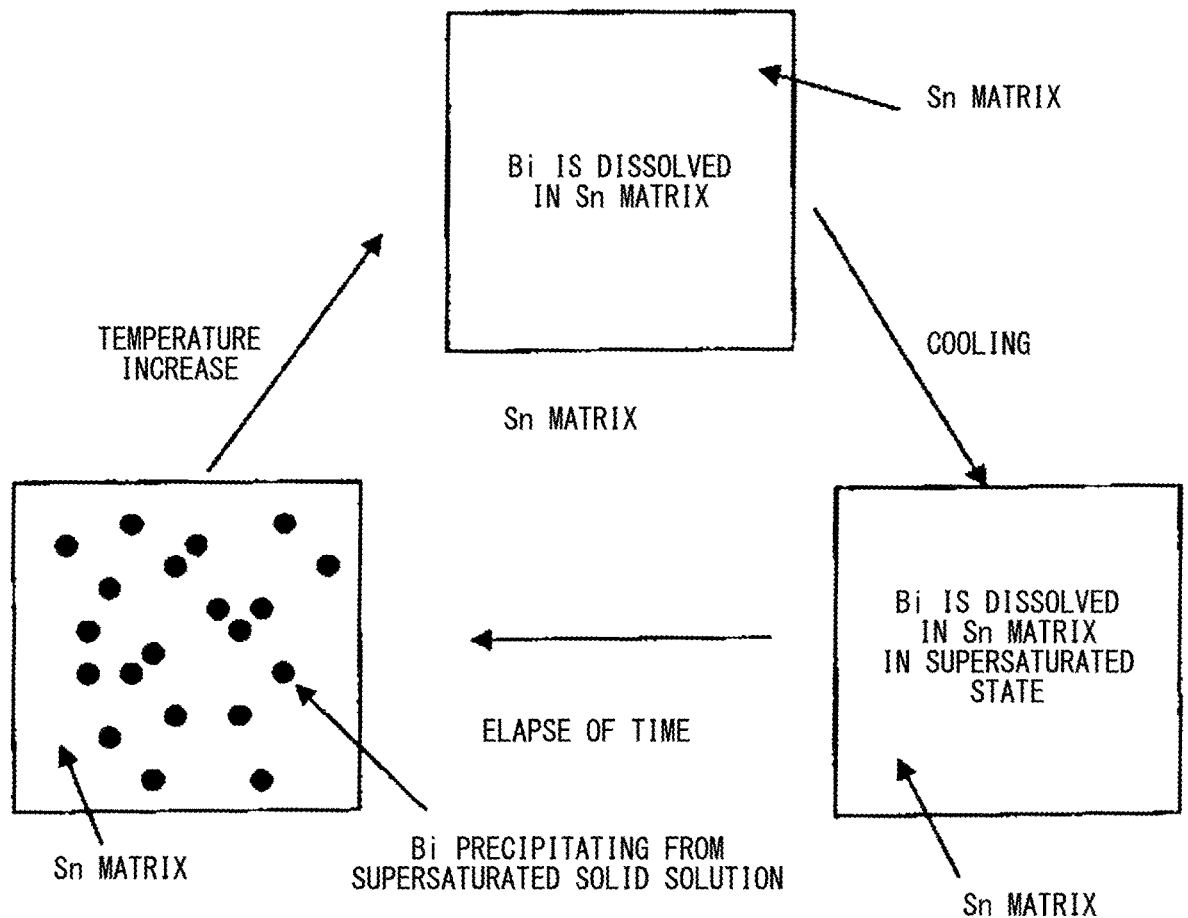
FIG. 1 is a schematic explanatory view of a "precipitate-recoverable solid solution structure" used in the present invention.

The present invention will be described in more detail below. In the present specification, "%" relating to a solder alloy composition is "mass %" unless otherwise specified.

1. Solder Alloy (1) Ag: 2.8% to 4%

Ag forms an intermetallic compound $Ag_3Sn$ with Sn and contributes to the improvement in heat cycle characteristics. In addition, Ag is effective for improving the wettability and decreasing the liquidus temperature of Sn. If the content of Ag is less than 2.8%, the heat cycle characteristics will deteriorate. The lower limit of the content of Ag is greater than or equal to 2.8% and preferably greater than or equal to 3.0%.

On the other hand, if the content of Ag is greater than 4%, not only the heat cycle characteristics or the wettability cannot be expected to be improved as much as the addition amount thereof, but also the liquidus temperature increases, thereby deteriorating the solderability. Furthermore, it is not economically preferable to increase the content of expensive Ag. The content of Ag is less than or equal to 4%, preferably less than or equal to 3.5%, more preferably less than or equal to 3.4%, and still more preferably less than or equal to 3.3%.

(2) Bi: 1.5% to 6%

The upper limit of the content of Bi is less than or equal to 6%. If the content of Bi is greater than this range, a large amount of an Sn—Bi eutectic structure produced through solidification segregation of Bi during soldering is crystallized. For this reason, in a heat cycle environment, Bi does not dissolve in Sn and excess Bi crystallized in a matrix is coarsened, and therefore, the heat cycle characteristics rather deteriorate. The upper limit of the content of Bi is preferably less than or equal to 5.5%, more preferably less than 5.0%, and still more preferably less than or equal to 4.0%.

On the other hand, if the content of Bi is less than 1.5%, precipitation of Bi exceeding the solid solution limit from a supersaturated solid solution at normal temperature can hardly be expected, and the target heat cycle characteristics cannot be satisfied. That is, the heat cycle characteristics are greatly improved by the interaction between a solid solution of Bi and precipitation from the supersaturated solid solution. The lower limit of the content of Bi is preferably greater than or equal to 2.0% and more preferably greater than or equal to 2.5%.

(3) Cu: 0.8% to 1.2%

Cu is required for preventing dissolution of Cu circuits on mounting substrates or Cu electrodes of electronic components. In usual soldering, a solder joint melts a plurality of times, and in a correction process, the temperature of the solder joint becomes higher than the usual soldering temperature. Therefore, Cu erosion in which Cu of a substrate or a component dissolves occurs. In particular, in a solder alloy containing Sn as a main component, Cu dissolves quickly and Cu of a substrate or a component is corroded.

In the present invention, such Cu erosion is prevented by incorporating Cu.

On the other hand, in Ni plating of semiconductor elements or ceramic substrates, in a case where the thickness of plating is thin, if soldering is performed with a solder alloy containing Sn as a main component, Ni dissolves violently and metal underneath the Ni plating is exposed. Therefore, the function of the Ni plating as a barrier layer is lost.

In particular, in in-vehicle electronic circuits, there are many mounting substrates or electronic components that are important for safety, and it is necessary to completely prevent disconnection or functional deterioration of electronic components during soldering. Therefore, it is important to prevent the dissolution of Cu of electrodes or the like. Furthermore, Cu also has an effect of suppressing the deterioration in shear strength in a heat cycle environment. In particular, in a case where the content of Bi is less than 5% and the content of Cu is less than 0.8%, the reliability does not reach the standard of in-vehicle electronic circuits. The lower limit of the content of Cu for preventing Cu erosion is necessarily greater than or equal to 0.8% and preferably greater than or equal to 0.9%.

However, if the content of Cu is greater than 1.2%, the liquidus temperature exceeds 240° C. Therefore, the soldering temperature has to be raised, which rather causes thermal damage to electronic components or printed circuit boards. The upper limit of the content of Cu is preferably less than or equal to 1.2% and preferably less than or equal to 1.0%.

(4) As: 0.0040% to 0.025%

Since As forms an As-concentrated layer on the surface of a solder alloy, the yellowish discoloration is suppressed. In addition, As is an element that can exhibit the thickening suppression effect if the solder alloy according to the present invention is added to a solder paste as a solder powder. The content of As needs to be greater than or equal to 0.0040% with regard to a lower limit thereof in order for the effects due to inclusion of As to be exhibited sufficiently. On the other hand, if the content of As is greater than 0.025%, the wettability deteriorates. The upper limit of the content of As is less than or equal to 0.025%, preferably less than or equal to 0.020%, and more preferably less than or equal to 0.010%.

The As-concentrated layer formed due to incorporation of As in the present invention is a region in which the concentration of As is higher than the average concentration (proportion of the mass of As in the mass of a solder alloy) of As in a solder material, and is specifically a region from the outermost surface of a solder alloy to a depth of 2×D1 (nm) in terms of $SiO_2$. The presence of the As-concentrated layer can be confirmed by determination criteria described below. The As-concentrated layer is preferably present on at least a part of the surface side of a solder alloy and preferably covers the entire surface.

If an As-concentrated layer is formed due to incorporation of As as in the present invention, the yellowish discoloration is suppressed and the change in viscosity of a solder paste over time can be suppressed. Although the reason for this is unclear, it is inferred to be as follows. It is thought that the increase in the viscosity is caused by formation of salts due to a reaction caused between Sn or an Sn oxide and various additives such as an activator contained in a solder paste (flux) or coagulation of a solder powder. It is inferred that, if an As-concentrated layer is present on the surface of the solder alloy according to the present invention, the As-concentrated layer is interposed between a solder powder and a flux, and the above-described reaction is unlikely to occur, and therefore, the above-described effects are simultaneously exhibited.

(4-1) Determination Criteria of As-Concentrated Layer

In a sample having a size of 5.0 mm×5.0 mm (in a case where a solder material is not plate-shaped, one obtained by spreading a solder material (such as a solder powder or a solder ball) without any gaps over a range of 5.0 mm×5.0 mm), an arbitrary area of 700 μm×300 μm is selected, and an XPS analysis is performed in combination with ion sputtering. One area is selected for each sample, and each of three samples is analyzed once, for a total of three analyses. In a case where S1≥S2 in all of the three analyses, it is determined that an As-concentrated layer has been formed.

Here, the definition of S1, S2, and D1 is as follows.

S1: Integrated value of a detection intensity of As in a region from a depth of 0 to 2×D1 (nm) in terms of $SiO_2$ in a chart of XPS analysis performed on the above-described sample S2: Integrated value of a detection intensity of As in a region from a depth of 2×D1 to 4×D1 (nm) in terms of $SiO_2$ in a chart of XPS analysis D1: Initial depth (nm) in terms of $SiO_2$ at which a detection intensity of O atoms is ½ a maximum detection intensity (intensity at Do·max) in a portion deeper than the depth (Do·max (nm)) in terms of $SiO_2$ at which a detection intensity of O atoms is a maximum in a chart of XPS analysis The detailed conditions of the above-described determination criteria of the As-concentrated layer follow the description of examples. By having an As-concentrated layer on the surface of the solder alloy according to the present invention, the yellowish discoloration of the solder alloy can be suppressed and the increase in the viscosity of a solder paste can be suppressed.

(4-2) Thickness of As-Concentrated Layer

The thickness (in terms of $SiO_2$) of an As-concentrated layer is 0.5 to 8.0 nm, more preferably 0.5 to 4.0 nm, and most preferably 0.5 to 2.0 nm. If the thickness of an As-concentrated layer is within the above-described ranges, a solder material of which the yellowish discoloration is suppressed and which has excellent wettability is obtained.

(4-3) Yellowness

In the present invention, yellowness b* in the L*a*b* color system of a solder alloy is preferably 0 to 10.0, more preferably 3.0 to 5.7, and most preferably 3.0 to 5.0. If the yellowness b* in the L*a*b* color system of a solder material is within the above-described ranges, the yellowness is low and the solder has metallic luster. Therefore, a solder joint is accurately detected during automatic processing of image recognition of the solder joint.

In the present invention, the yellowness b* can be obtained from color values (L*, a*, b*) by measuring spectral transmittance according to "Methods of Color Measurement-Color of Reflecting and Transmitting Objects" of JIS Z 8722:2009 with a light source D65 and a 10-degree field of view using a CM-3500d2600d-type spectrocolorimeter (manufactured by Konica Minolta, Inc.)

(5) Expressions (1) and (2)

The solder alloy according to the present invention preferably satisfies Expressions (1) and (2) below.

$$0.39 \leq 1{,}000 \times As/(Ag+Cu+Bi) \leq 0.71 \quad (1)$$

$$0.67 \leq 1{,}000 \times As/Bi \leq 2.67 \quad (2)$$

In Expressions (1) and (2), As, Ag, Cu, and Bi each represent a content (mass %) in the solder alloy.

The solder alloy according to the present invention has the above-described reasons for the addition of Ag, Bi, Cu, and As. However, there are many objects of the present invention to improve the heat cycle characteristics and to suppress the Cu erosion, the yellowish discoloration, and the thickening of a solder paste. For this reason, in order to simultaneously satisfy these and achieve each of the purposes more sufficiently, it is preferable to satisfy Expressions (1) and (2).

The lower limit of Expression (1) is more preferably greater than or equal to 0.43, still more preferably greater than or equal to 0.44, particularly preferably greater than or equal to 0.45, and most preferably greater than or equal to 0.48. The upper limit of Expression (1) is more preferably less than or equal to 0.70, still more preferably less than or equal to 0.69, particularly preferably less than or equal to 0.67, and still more preferably less than or equal to 0.65.

The lower limit of Expression (2) is more preferably greater than or equal to 0.80, still more preferably greater than or equal to 0.89, and particularly preferably greater than or equal to 1.00. The upper limit of Expression (2) is more preferably less than or equal to 2.00, still more preferably less than or equal to 1.60, and particularly preferably less than or equal to 1.33.

(6) One or More Selected from Group Consisting of Ni, Fe, and Co: 0.005% to 0.05% in Total, Ni: 0.02% to 0.04%

In order to further improve the heat cycle characteristics and to improve characteristics such as the mechanical strength of a solder itself and the suppression of Cu erosion, the solder alloy according to the present invention may contain one or more selected from the group consisting of Ni, Fe, and Co in total of 0.005% to 0.05%. If the total content of these elements is greater than or equal to 0.005%, the effect of improving the above-described characteristics is sufficiently exhibited. If the total content thereof is less than or equal to 0.05%, the increase in the liquidus temperature can be suppressed. The content of Ni is preferably 0.02% to 0.04%, the content of Fe is preferably 0.01% to 0.05%, and the content of Co is preferably 0.008% to 0.05%. In particular, the solder alloy according to the present invention preferably contains 0.02% to 0.04% of Ni alone.

(7) Total Amount of 0.0002% to 0.02% of One or More Selected from Group Consisting of P, Ge, and Ga Furthermore, in order to promote the effect of As that prevents oxidation of the solder alloy and suppresses discoloration of the solder alloy, the solder alloy according to the present invention may also contain one or more selected from the group consisting of P, Ge, and Ga in total of 0.0002% to 0.02%. If the total content thereof is greater than or equal to 0.0002%, the effect of preventing the oxidation is exhibited. If the total content thereof is less than or equal to 0.02%, the solderability is not impaired. The content of P is preferably 0.0002% to 0.015%, the content of Ge is preferably 0.003% to 0.015%, and the content of Ga is preferably 0.003% to 0.015%.

(8) In: Less than or Equal to 1%, Zn: Less than or Equal to 1%

The solder alloy according to the present invention may contain In or Zn as necessary. In lowers the melting temperature of a solder alloy. If the content of In is less than or equal to 1%, solidification segregation due to both Bi and In is suppressed, and a solder alloy can be prevented from partially melting at 125° C. or lower. If there is no liquid phase of Sn in which In and Bi are concentrated in an Sn matrix at a high temperature of 125° C., the strength does not change much and the ductility, so-called elongation, does not decrease greatly. For this reason, the content of In with respect to an Sn—Ag—Bi—Cu—As solder alloy is preferably less than or equal to 1% and more preferably less than or equal to 0.8%.

While Zn is highly oxidized, it enhances the reactivity with metal. Therefore, the solderability in an inert atmosphere improves. If the content of Zn is suppressed with respect to an Sn—Ag—Bi—Cu—As solder alloy, the liquidus temperature does not increase greatly. Therefore, the content thereof is preferably less than or equal to 1% and more preferably less than or equal to 0.2%.

(9) Balance: Sn

The balance of the solder alloy according to the present invention is Sn. The solder alloy may contain unavoidable impurities in addition to the above-described elements. The inclusion of unavoidable impurities does not affect the above-described effects.

2. Solder Paste

The solder paste according to the present invention contains the solder powder of the present embodiment and a flux.

(1) Component of Flux

A flux used in the solder paste is composed of any one or a combination of two or more of an organic acid, an amine, an amine hydrohalide, an organic halogen compound, a thixotropic agent, rosin, a solvent, a surfactant, a base agent, a polymer compound, a silane coupling agent, and a colorant.

Examples of organic acids include succinic acid, glutaric acid, adipic acid, pimelic acid, suberic acid, azelaic acid, sebacic acid, dimer acids, propionic acid, 2,2-bishydroxymethylpropionic acid, tartaric acid, malic acid, glycolic acid, diglycolic acid, thioglycolic acid, dithioglycolic acid, stearic acid, 12-hydroxystearic acid, palmitic acid, and oleic acid.

Examples of amines include ethylamine, triethylamine, ethylenediamine, triethylenetetramine, 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, a 2,4-diamino-6-[2'-methylimidazolyl-(1')]-ethyl-s-triazine-isocyanuric acid adduct, a 2-phenylimidazole-isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, 2-phenylimiclanline, 2,4-diamino-6-vinyl-s-triazine, a 2,4-diamino-6-vinyl-s-triazine-isocyanuric acid adduct, 2,4-diamino-6-methacryloyloxyethyl-s-triazine, an epoxy-imidazole adduct, 2-methylbenzimidazole, 2-octylbenzimidazole, 2-pentylbenzimidazole, 2-(1-ethylpentyl) benzimidazole, 2-nonylbenzimidazole, 2-(4-thiazolyl) benzimidazole, benzimidazole, 2-(2'-hydroxy-5'-methylphenyl) benzotriazole, 2-(2'-hydroxy-3'-tert-butyl-5'-methylphenyl)-5-chlorobenzotriazole, 2-(2'-hydroxy-3',5'-di-tert-amylphenyl) benzotriazole, 2-(2'-hydroxy-5'-tert-octylphenyl) benzotriazole, 2,2'-methylenebis[6-(2H-benzotriazole-2-yl)-4-tert-octylphenol], 6-(2-benzotriazolyl)-4-tert-octyl-6'-tert-butyl-4'-methyl-2,2'-methylenebisphenol, 1,2,3-benzotriazole, 1-[N,N-bis(2-ethylhexyl) aminomethyl] benzotriazole, carboxybenzotriazole, 1-[N,N-bis(2-ethylhexyl) aminomethyl]methylbenzotriazole, 2,2'-[[(methyl-1H-benzotriazole-1-yl) methyl]imino]bisethanol, 1-(1',2'-dicarboxyethyl) benzotriazole, 1-(2,3-dicarboxypropyl) benzotriazole, 1-[(2-ethylhexyl) aminomethyl]benzotriazole, 2,6-bis[(1H-benzotriazole-1-yl) methyl]-4-methylphenol, 5-methylbenzotriazole, and 5-phenyltetrazole.

An amine hydrohalide is a compound obtained by reacting an amine and a hydrogen halide, and examples of amines include ethylamine, ethylenediamine, triethylamine, diphenylguanidine, ditolylguanidine, methylimidazole, and 2-ethyl-4-methylimidazole, and examples of hydrogen halides include hydrides of chlorine, bromine, and iodine.

Examples of organic halogen compounds include trans-2,3-dibromo-2-butene-1,4-diol, triallyl isocyanurate hexabromide, 1-bromo-2-butanol, 1-bromo-2-propanol, 3-bromo-1-propanol, 3-bromo-1,2-propanediol, 1,4-dibromo-2-butanol, 1,3-dibromo-2-propanol, 2,3-dibromo-1-propanol, 2,3-dibromo-1,4-butanediol, and 2,3-dibromo-2-butene-1,4-diol.

Examples of thixotropic agents include a wax-based thixotropic agent, an amide-based thixotropic agent, and a sorbitol-based thixotropic agent. Examples of wax-based thixotropic agents include hydrogenated castor oil. Examples of amide-based thixotropic agents include a monoamide-based thixotropic agent, a bisamide-based thixotropic agent, and a polyamide-based thixotropic agent, and specific examples thereof include lauric acid amide, palmitic acid amide, stearic acid amide, behenic acid amide, hydroxystearic acid amide, saturated fatty acid amides, oleic acid amide, erucic acid amide, unsaturated fatty acid amides, p-toluene methane amide, aromatic amide, methylenebisstearic acid amide, ethylenebislauric acid amide, ethylenebishydroxystearic acid amide, saturated fatty acid bisamide, methylenebisoleic acid amide, unsaturated fatty acid bisamide, m-xylylenebisstearic acid amide, aromatic bisamide, saturated fatty acid polyamide, unsaturated fatty acid polyamide, aromatic polyamide, substituted amides, methylol stearic acid amide, methylol amide, and fatty acid ester amides. Examples of sorbitol-based thixotropic agents include dibenzylidene-D-sorbitol and bis(4-methylbenzylidene)-D-sorbitol.

Examples of base agents include nonionic surfactants, weak cationic surfactants, and rosin.

Examples of nonionic surfactants include polyethylene glycol, a polyethylene glycol-polypropylene glycol copolymer, an aliphatic alcohol-polyoxyethylene adduct, an aromatic alcohol-polyoxyethylene adduct, and a polyhydric alcohol-polyoxyethylene adduct.

Examples of weak cationic surfactants include terminal diamine polyethylene glycol, a terminal diamine polyethylene glycol-polypropylene glycol copolymer, an aliphatic amine-polyoxyethylene adduct, an aromatic amine-polyoxyethylene adduct, and a polyvalent amine-polyoxyethylene adduct.

Examples of rosin include raw rosin such as gum rosin, wood rosin, and tall oil rosin, and derivatives obtained from the raw rosin. Examples of the derivatives include purified rosin, hydrogenated rosin, disproportionated rosin, polymerized rosin, an $\alpha,\beta$-unsaturated carboxylic acid-modified product (such as acrylated rosin, maleated rosin, or fumarated rosin), a purified product, a hydride, and a disproportionated product of the polymerized rosin, and a purified product, a hydride, and a disproportionated product of $\alpha,\beta$-unsaturated carboxylic acid-modified products, and two or more kinds thereof can be used. In addition to a rosin resin, the flux can further contain at least one resin selected from a terpene resin, a modified terpene resin, a terpene phenol resin, a modified terpene phenol resin, a styrene resin, a modified styrene resin, a xylene resin, and a modified xylene resin. An aromatic modified terpene resin, a hydrogenated terpene resin, a hydrogenated aromatic modified terpene resin, or the like can be used as a modified terpene resin. A hydrogenated terpene phenol resin or the like can be used as a modified terpene phenol resin. A styrene-acrylic resin, a styrene-maleic acid resin, or the like can be used as a modified styrene resin. Examples of modified xylene resins include a phenol-modified xylene resin, an alkylphenol-modified xylene resin, a phenol-modified resol-type xylene resin, a polyol-modified xylene resin, and a polyoxyethylene-added xylene resin.

Examples of solvents include water, an alcoholic solvent, a glycol ether-based solvent, and terpineols. Examples of alcoholic solvents include isopropyl alcohol, 1,2-butanediol, isobornyl cyclohexanol, 2,4-diethyl-1,5-pentanediol, 2,2-dimethyl-1,3-propanediol, 2,5-dimethyl-2,5-hexanediol, 2,5-dimethyl-3-hexyne-2,5-diol, 2,3-dimethyl-2,3-butanediol, 1,1,1-tris(hydroxymethyl)ethane, 2-ethyl-2-hydroxymethyl-1,3-propanediol, 2,2'-oxybis(methylene)bis(2-ethyl-1,3-propanediol), 2,2-bis(hydroxymethyl)-1,3-propanediol, 1,2,6-trihydroxyhexane, bis[2,2,2-tris(hydroxymethyl)ethyl]ether, 1-ethynyl-1-cyclohexanol, 1,4-cyclohexanediol, 1,4-cyclohexane dimethanol, erythritol, threitol, guaiacol glycerol ether, 3,6-dimethyl-4-octyne-3,6-diol, and 2,4,7,9-tetramethyl-5-decyne-4,7-diol. Examples of glycol ether-based solvents include diethylene glycol mono-2-ethylhexyl ether, ethylene glycol monophenyl ether, 2-methylpentane-2,4-diol, diethylene glycol monohexyl ether, diethylene glycol dibutyl ether, and triethylene glycol monobutyl ether.

Examples of surfactants include polyoxyalkylene acetylene glycols, polyoxyalkylene glyceryl ether, polyoxyalkylene alkyl ether, polyoxyalkylene ester, polyoxyalkylene alkylamine, and polyoxyalkylene alkylamide.

(2) Content of Flux

The content of a flux based on the total mass of a solder paste is preferably 5% to 95% and more preferably 5% to 15%. Within these ranges, the thickening suppression effect due to a solder powder is sufficiently exhibited.

(3) Solder Powder

A solder powder used in the solder paste according to the present invention is preferably a spherical powder. The spherical powder improves the fluidity of solder alloys.

In addition, in the case where the solder alloy is spherical powders which have sizes (grain size distribution) corresponding to Symbols 1 to 8 in the classification (Table 2) of the powder size in JIS Z 3284-1:2014, soldering on fine components can be performed. Particulate solder materials more preferably have sizes corresponding to Symbols 4 to 8 and more preferably have sizes corresponding to Symbols 5 to 8. The sphericity thereof is preferably greater than or equal to 0.90, more preferably greater than or equal to 0.95, and most preferably greater than or equal to 0.99.

In the present invention, the spherical diameter and the sphericity of a solder alloy which is a spherical powder is measured with a CNC image measurement system (Ultra Quick Vision ULTRA QV350-PRO Measurement Device manufactured by Mitutoyo Corporation) in which minimum zone center method (MZC method) is used. In the embodiment, the sphericity represents deviation from a true sphere and is an arithmetic average value calculated when, for example, diameters of 500 balls are divided by major axes. As the value is closer to 1.00 which is the upper limit, the balls are closer to true spheres.

(4) Method for Producing Solder Paste

The solder paste according to the present invention is produced through a method common in the art. First, well-known methods such as a dropping method in which a molten solder material is added dropwise to obtain particles, a spraying method in which the molten solder material is centrifugally sprayed, and a method in which a bulk solder material is pulverized can be employed for the production of a solder powder. In the dropping method or the spraying method, dropping or spraying is preferably performed in an inert atmosphere or a solvent in order to form particles. The above-described components can be heated and mixed with each other to prepare a flux, the above-described solder powder can be introduced into the flux, and the mixture can be stirred and mixed to produce a solder paste.

3. Solder Ball

The solder alloy according to the present invention can be used as a solder ball. In the case where the solder alloy according to the present invention is used as a solder ball, a solder ball can be produced through a dropping method which is a method common in the art. In addition, a solder joint can be produced by processing a solder ball through a method common in the art, for example, through joining of the solder ball by mounting the solder ball on one electrode coated with a flux. The particle diameter of a solder ball is preferably greater than or equal to 1 μm, more preferably greater than or equal to 10 μm, still more preferably greater than or equal to 20 μm, and particularly preferably greater than or equal to 30 μm. The upper limit of the particle diameter of a solder ball is preferably less than or equal to 3,000 μm, more preferably less than or equal to 1,000 μm, still more preferably less than or equal to 600 μm, and particularly preferably less than or equal to 300 μm.

4. Solder Preform

The solder alloy according to the present invention can be used as a preform. Examples of the shape of a preform include washers, rings, pellets, discs, ribbons, and wires.

5. Solder Joint

The solder alloy according to the present invention can be used as a joint for joining two or more various members. The solder alloy according to the present invention exhibits a required strength as, for example, a Bi-containing solid solution at a high temperature of 100° C. or higher, and, as necessary, a Bi-containing solid solution in which some intermetallic compounds are dispersed. On the other hand, the solder alloy according to the present invention exhibits a required strength due to a Bi supersaturated solid solution at a low temperature of 25° C. or lower or strengthened precipitation of Bi. No solder joint with such a function has been found so far.

6. Circuit

The circuit according to the present invention is an electrical circuit and includes the solder joint described above. Therefore, it is preferable that the circuit according to the present invention be an in-vehicle electronic circuit that requires excellent reliability, particularly a hybrid semiconductor circuit. In addition, the present invention including a solder alloy can also be used in a power module.

In hybrid semiconductor circuits in which power modules, ceramic substrates, or metal substrates are used, a function of converting the voltage, currents, or frequencies of input power sources is important. The input power sources include high-output lithium ion batteries, lead storage batteries used in vehicles or two-wheel vehicles, power generation using motors of vehicles and trains, transmission lines, or domestic power sources of 100 V to 220 V.

The circuit according to the present invention operates a driving portion of a motor by converting these input power sources, turns on headlights that require a large amount of power like headlights of vehicles, and converts batteries generated from electromagnetic coils during motor braking to charge lithium batteries or lead storage batteries. For this reason, the amount of heat generated in the circuit is large. In addition, large components having a 3216 size are used as chip components such as resistors or capacitors which are indispensable for forming electronic circuits. Accordingly, in these electronic circuits, solder joints with printed circuit boards are likely to break due to heat cycling.

Power modules are circuits in which power transistors are used in electronic circuits thereof, and are used in power source circuits or the like. Since heat radiation plates or the like are often arranged and a large current flows, the power modules are characterized by thick wiring and a wide area of a solder joint.

Hybrid semiconductor circuits are also called hybrid integrated circuits and obtained by attaching a semiconductor chip to a ceramic substrate on which wiring and resistors or capacitors are formed. Although such electronic circuits are integrated circuits before one generation, since integrated circuits in which silicon wafers are used have defects as they are weak against heat, hybrid semiconductor circuits in which a large current flows and which are resistant to heat are still used for in-vehicle purposes. In such hybrid semiconductor circuits, large chip components can be used.

7. Method for Forming Solder Alloy

A method for producing the solder alloy according to the present invention is not limited and can be produced by melting and mixing raw materials.

A method for forming an As-concentrated layer in a solder alloy is also not limited. Examples of the method for forming an As-concentrated layer include heating of a solder material in an oxidation atmosphere (air or oxygen atmosphere). The heating temperature is not limited, but can be set to, for example, 40° C. to 200° C., and may be 50° C. to 80° C. The heating time is also not limited, and can be set to, for example, several minutes to several days and preferably several minutes to several hours. In order to form a sufficient amount of an As-concentrated layer, the heating time is preferably longer than or equal to 10 minutes and more preferably longer than or equal to 20 minutes. By subjecting the above-described solder powder, solder ball, and solder preform to, for example, this heat treatment, an As-concentrated layer is formed.

A low α-ray material can be used as a raw material of the solder alloy according to the present invention to produce a low α-ray alloy. If such a low α-ray alloy is used to form solder bumps around a memory, soft errors can be suppressed.

EXAMPLES

1. As-Concentrated Surface Layer, 2. Heat Cycle Characteristics, 3. Cu erosion, 4. Suppression of Thickening, and 5. Suppression of Yellowing were evaluated using solder alloys (mass %) shown in examples and comparative examples in Tables 1 to 5.
1. As-Concentrated Surface Layer An As-concentrated surface layer was evaluated as follows using depth direction analysis through X-ray photoelectron spectroscopy (XPS).

Analysis Conditions

Analyzer: Micro-region X-ray photoelectron spectroscopic analyzer (AXIS Nova manufactured by Kratos Analytical Limited)

Analysis condition: X-Ray source being AlKα line, X-ray gun voltage being 15 kV, X-ray gun current value being 10 mA, and analysis area being 700 μm×300 μm Sputtering conditions: Ion type being Ar+, accelerating voltage being 2 kV, sputtering rate being 0.5 nm/min (in terms of $SiO_2$)

Samples: Three samples obtained by flatly spreading each solder powder having the alloy composition shown in Tables 1 to 5 without any gap on a stage to which carbon tape was stuck were prepared as samples. However, the sizes of the samples were set to 5.0 mm×5.0 mm. The solder powders were obtained by heating solder powders which have an average particle diameter of 21 μm and correspond to 5 in the classification (Table 2) of the powder size in JIS Z3284-1:2014 for 30 minutes at 60° C. with a dryer in atmospheric air. Solder powders which have not been subjected to heat treatment were used only in Comparative Examples 25 and 26.

Evaluation Procedure

An arbitrary area of 700 μm×300 μm was selected from each sample having a size of 5.0 mm×5.0 mm, and XPS analysis was performed on each of Sn, O, and As atoms while performing ion sputtering to obtain an XPS analysis chart. One area was selected for each sample, and each of three samples was analyzed once, for a total of three analyses.

Figure 2:
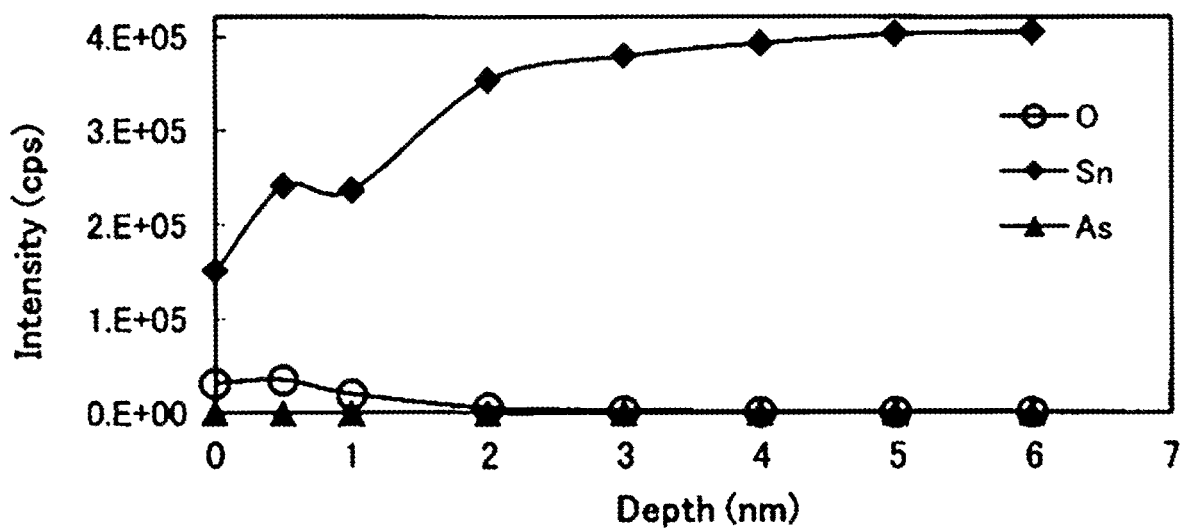
FIG. 2 is a chart of XPS analysis of a surface of a solder ball.
Figure 3:
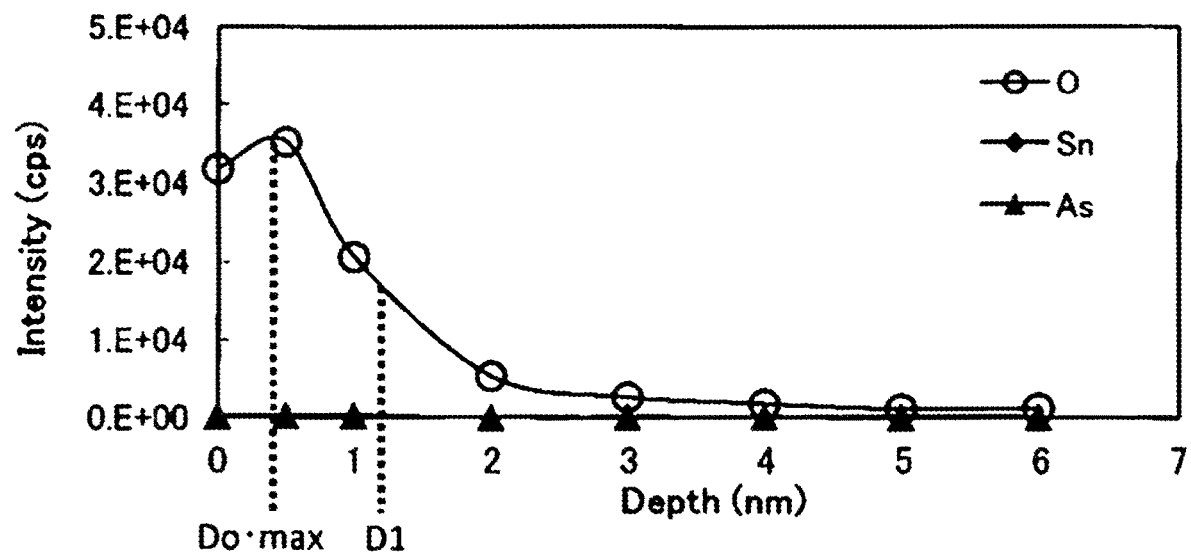
FIG. 3 is a chart of XPS analysis of a surface of a solder ball.
Figure 4:
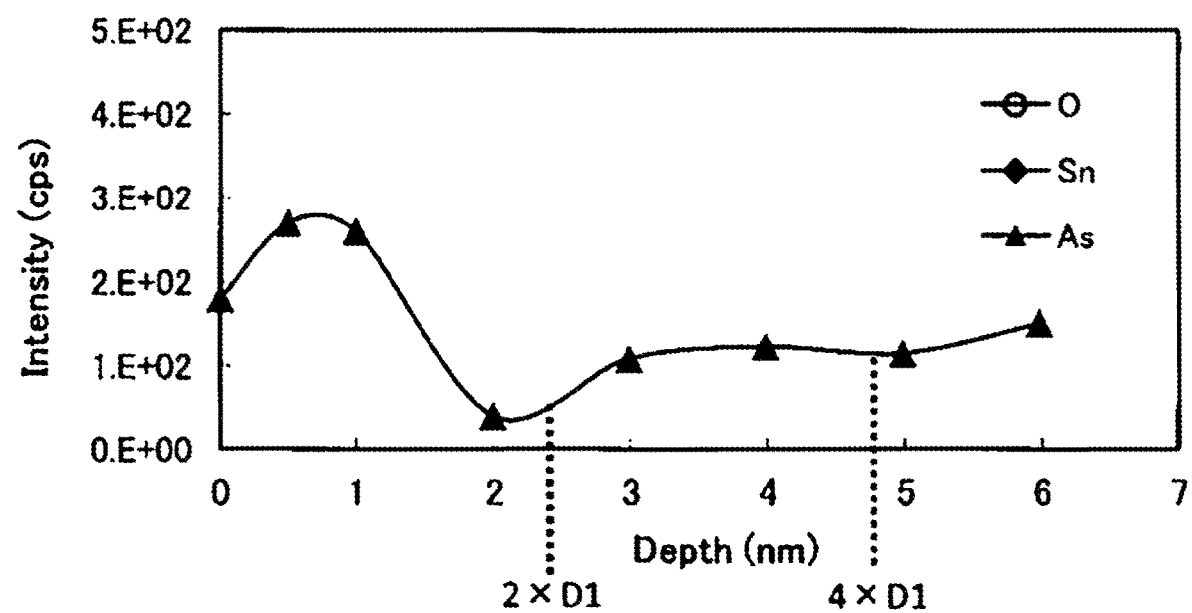
FIG. 4 is a chart of XPS analysis of a surface of a solder ball.

Examples of charts obtained from the XPS analysis are shown in FIGS. 2 to 4. FIGS. 2 to 4 are charts in which the scale of the detection intensity (cps) on the vertical axis is changed for an identical sample, and the horizontal axis is the depth (nm) in terms of $SiO_2$ calculated from the sputtering time. In the XPS analysis charts, the vertical axis is the detection intensity (cps). Although the horizontal axis can be selected from either the sputtering time (min) or the depth (nm) in terms of $SiO_2$ calculated from the sputtering time using a sputter-etching rate of an $SiO_2$ standard sample, the horizontal axis in the XPS analysis charts in FIGS. 2 to 4 is the depth (nm) in terms of $SiO_2$ calculated from the sputtering time using a sputter-etching rate of an $SiO_2$ standard sample.

Moreover, in the XPS analysis chart of each sample, the depth in terms of $SiO_2$ at which the detection intensity of an O atom was maximum was set to Do·max (nm) (refer to FIG. 3). Moreover, the initial depth in terms of $SiO_2$ at which the detection intensity of an O atom was ½ maximum detection intensity (intensity at Do·max) in a portion deeper than Do·max was set to D1 (nm).

Subsequently, in the XPS analysis chart of each sample, an integrated value (S1) of the detection intensity of As in a region (region where the depth in terms of $SiO_2$ was 0 to 2×D1 (nm)) from the outermost surface to the depth 2×D1 and an integrated value (S2) of the detection intensity of As in a region (region where the depth in terms of $SiO_2$ was 2×D1 to 4×D1 (nm)) from the depth 2×D1 to a portion deeper by 2×D1 were obtained (refer to FIG. 4) and were compared from each other.

Then, an evaluation was performed based on the following criteria.

S1>S2 at all three times of measurement: As-Concentrated layer is formed: (O)

S1>S2 at two or less times out of all three times of measurement: No As-concentrated layer is formed: (X)
2. Heat Cycle Characteristics Each solder powder obtained in "1. As-Concentrated Surface Layer" was heated and stirred with a flux having the following composition and used as a solder paste.

Solder powder: 89 mass %
Flux: 11 mass %
Composition of Flux:
Polymerized rosin 55 mass %
Hydrogenated caster oil 7 mass %
Diphenylguanidine HBr 1 mass %
Diethylene glycol monohexyl ether 37 mass %

A chip resistor component having a size of 3.2×1.6×0.6 (mm) was soldered onto a soldering pattern (1.6×1.2 (mm)) in a 6-layer FR-4 glass epoxy substrate having a size of 150 mm×140 mm and a thickness of 1.6 mm. The soldering was performed such that a solder paste was printed on an electrode portion using a metal mask having a thickness of 150 μm and heated in a reflow furnace of which the peak temperature was set to 245° C. Thereafter, the printed substrate on which the chip resistor component was mounted was placed in a heat cycle tank set at the condition in which the printed substrate was held at each of −55° C. and +125° C. for 30 minutes each, and the mounting substrate after exposing the printed substrate to a heat cycle environment in which the cycle was repeated 1,500 or 3,000 cycles was used as a test sample.

The chip resistor component was peeled off at a shear rate of 5 mm/min using a shear strength tester, and the peeling strength (newton: N) of the chip resistor component of the test sample was measured. The number of test samples used each time was 15 to 20.

In a heat cycle test, the shear strength deteriorates mainly due to occurrence of cracks. The more intensely the cracks progress, the lower the shear strength. In this heat cycle test, if cracks completely penetrate a solder joint, the strength thereof becomes less than or equal to 10 N. In a heat cycle test performing 1,500 cycles, if the average shear strength is greater than or equal to 30 N and the minimum shear strength is greater than or equal to 20 N, cracks do not completely penetrate a solder joint, which has sufficient reliability and is evaluated as "O". Moreover, even in a case of more severe conditions of 3,000 cycles, if the average shear strength is greater than or equal to 30 N and the minimum shear strength is greater than or equal to 20 N, it is possible to promise the reliability for a longer period of time. Therefore, it is evaluated as "OO".

3. Cu erosion

Each alloy is placed in a small jet solder bath having a capacity of 15 kg and brought into a molten state at 260° C. Then, the jet height from a jet port of the jet solder bath is adjusted to 5 mm.

The test samples used in this test are obtained by cutting a FR-4 glass epoxy substrate having a copper wiring thickness of 35 μm into an appropriate size.

Regarding the test method, preflux is applied to the copper wiring surface of each test sample and is preheated for about 60 seconds to set the temperature of each substrate to about 120° C. Thereafter, the test sample is placed 2 mm above the jet port of the jet solder bath and immersed in jetting molten solder for 3 seconds. This process is repeated, and the number of times of immersion until the size of the copper wiring of the test sample is halved is measured. Considering the reliability of an in-vehicle electronic circuit, the size thereof should not be halved even if the number of times of immersion is 4 or more. A case where the size thereof is not halved when the number of times of immersion is 4 is evaluated as "O", and a case where the size thereof is halved when the number of times of immersion is 3 or less is evaluated as "X".

4. Suppression of Thickening

The viscosity of the solder pastes obtained in the same manner as in the above-described "2. Heat Cycle Characteristics" was continuously measured for 12 hours at a rotation frequency of 10 rpm and a measurement temperature of 25° C. using a rotational viscometer (PCU-205 manufactured by Malcolm Co., Ltd.) according to the method described in "4.2 Test for Viscosity Characteristics" of JIS Z 3284-3:2014. An initial viscosity (viscosity after 30 minutes of stirring) was compared with a viscosity after 12 hours to evaluate the thickening suppression effect based on the following criteria.

Viscosity after 12 hours initial viscosity×1.2: Favorable due to small increase in viscosity over time: (O)

Viscosity after 12 hours>initial viscosity×1.2: Failure due to large increase in viscosity over time: (X)

5. Suppression of Yellowing

The solder balls (with a spherical diameter of 0.3 mm) having the alloy compositions shown in Tables 1 to 5 were heated for 30 minutes at 60° C. using a dryer in atmospheric air and then heated for 2 hours in a constant-temperature tank at 200° C. in an air atmosphere. The yellowness b* of the solder balls in the L*a*b* color system before and after heating was measured, and the amount of increase (Ab*) obtained by subtracting b* before heating from b* after heating was calculated. Solder balls which have not been subjected to heat treatment were used only in Comparative Examples 25 and 26 and introduced into a constant-temperature tank.

The yellowness b* was obtained from color values (L*, a*, b*) by measuring spectral transmittance according to "Methods of Color Measurement-Color of Reflecting and Transmitting Objects" of JIS Z 8722:2009 with a light source D65 and a 10-degree field of view using a CM-3500d2600d-type spectrocolorimeter (manufactured by Konica Minolta, Inc.) The color values (L*, a*, b*) are based on the standard of JIS Z 8781-4:2013.

The value Δb* is less than or equal to 70% of Δb* (reference): O (Good)

The value Δb* is greater than 70% of Δb* (reference): X (Poor)

6. Comprehensive Evaluation

In a case where all of the above-described tests scored "O" or "OO", it was evaluated as "O". In a case where any one of the tests scored "X", it was evaluated as "X".

The evaluation results are shown in Tables 1 to 5.

TABLE 1

| | Sn | Ag | Bi | Cu | As | Ni | Co | Fe | P | Ga | Ge | In | Zn | 1,000 × As/(Ag + Cu + Bi) | 1,000 × As/Bi | As-concentrated surface layer | Heat cycle characteristics | Cu erosion | Thickening suppression of paste | Suppression of yellowing during heating solder piece | Comprehensive evaluation |
|---|---|---|---|---|---|---|---|---|---|---|---|---|---|---|---|---|---|---|---|---|---|
| Example 1 | Bal. | 3.3 | 1.5 | 0.9 | 0.0040 | — | — | — | — | — | — | — | — | 0.70 | 2.67 | ○ | ○ | ○ | ○ | ○ | ○ |
| Example 2 | Bal. | 3.3 | 2.0 | 0.9 | 0.0040 | — | — | — | — | — | — | — | — | 0.65 | 2.00 | ○ | ○ | ○ | ○ | ○ | ○ |
| Example 3 | Bal. | 3.3 | 2.5 | 0.9 | 0.0040 | — | — | — | — | — | — | — | — | 0.60 | 1.60 | ○ | ○ | ○ | ○ | ○ | ○ |
| Example 4 | Bal. | 3.3 | 3.0 | 0.9 | 0.0040 | — | — | — | — | — | — | — | — | 0.56 | 1.33 | ○ | ◎ | ○ | ○ | ○ | ○ |
| Example 5 | Bal. | 3.3 | 4.0 | 0.9 | 0.0040 | — | — | — | — | — | — | — | — | 0.49 | 1.00 | ○ | ◎ | ○ | ○ | ○ | ○ |
| Example 6 | Bal. | 3.3 | 5.0 | 0.9 | 0.0040 | — | — | — | — | — | — | — | — | 0.43 | 0.80 | ○ | ◎ | ○ | ○ | ○ | ○ |
| Example 7 | Bal. | 3.3 | 6.0 | 0.9 | 0.0040 | — | — | — | — | — | — | — | — | 0.39 | 0.67 | ○ | ◎ | ○ | ○ | ○ | ○ |
| Example 8 | Bal. | 3.5 | 1.5 | 0.8 | 0.0040 | — | — | — | — | — | — | — | — | 0.69 | 2.67 | ○ | ○ | ○ | ○ | ○ | ○ |
| Example 9 | Bal. | 3.5 | 2.0 | 0.8 | 0.0040 | — | — | — | — | — | — | — | — | 0.63 | 2.00 | ○ | ○ | ○ | ○ | ○ | ○ |
| Example 10 | Bal. | 3.5 | 3.0 | 0.8 | 0.0040 | — | — | — | — | — | — | — | — | 0.55 | 1.33 | ○ | ◎ | ○ | ○ | ○ | ○ |
| Example 11 | Bal. | 3.5 | 4.0 | 0.8 | 0.0040 | — | — | — | — | — | — | — | — | 0.48 | 1.00 | ○ | ◎ | ○ | ○ | ○ | ○ |
| Example 12 | Bal. | 3.5 | 4.5 | 0.8 | 0.0040 | — | — | — | — | — | — | — | — | 0.45 | 0.89 | ○ | ◎ | ○ | ○ | ○ | ○ |
| Example 13 | Bal. | 3.5 | 1.5 | 1.1 | 0.0040 | — | — | — | — | — | — | — | — | 0.71 | 2.67 | ○ | ○ | ○ | ○ | ○ | ○ |
| Example 14 | Bal. | 4.0 | 1.5 | 1.1 | 0.0040 | — | — | — | — | — | — | — | — | 0.62 | 2.67 | ○ | ○ | ○ | ○ | ○ | ○ |
| Example 15 | Bal. | 3.0 | 4.0 | 1.1 | 0.0040 | — | — | — | — | — | — | — | — | 0.49 | 1.00 | ○ | ◎ | ○ | ○ | ○ | ○ |
| Example 16 | Bal. | 4.0 | 4.0 | 1.1 | 0.0040 | — | — | — | — | — | — | — | — | 0.44 | 1.00 | ○ | ◎ | ○ | ○ | ○ | ○ |
| Example 17 | Bal. | 3.0 | 5.0 | 1.1 | 0.0040 | — | — | — | — | — | — | — | — | 0.44 | 0.80 | ○ | ◎ | ○ | ○ | ○ | ○ |
| Example 18 | Bal. | 4.0 | 5.0 | 1.2 | 0.0040 | — | — | — | — | — | — | — | — | 0.39 | 0.80 | ○ | ◎ | ○ | ○ | ○ | ○ |
| Example 19 | Bal. | 3.0 | 2.0 | 0.8 | 0.0040 | 0.02 | — | — | — | — | — | — | — | 0.69 | 2.00 | ○ | ○ | ○ | ○ | ○ | ○ |
| Example 20 | Bal. | 3.0 | 3.0 | 0.8 | 0.0040 | 0.02 | — | — | — | — | — | — | — | 0.59 | 1.33 | ○ | ◎ | ○ | ○ | ○ | ○ |
| Example 21 | Bal. | 3.0 | 4.0 | 0.8 | 0.0040 | 0.02 | — | — | — | — | — | — | — | 0.51 | 1.00 | ○ | ◎ | ○ | ○ | ○ | ○ |
| Example 22 | Bal. | 3.0 | 2.0 | 0.8 | 0.0040 | 0.05 | — | — | — | — | — | — | — | 0.69 | 2.00 | ○ | ○ | ○ | ○ | ○ | ○ |
| Example 23 | Bal. | 3.0 | 3.0 | 0.8 | 0.0040 | 0.05 | — | — | — | — | — | — | — | 0.59 | 1.33 | ○ | ◎ | ○ | ○ | ○ | ○ |
| Example 24 | Bal. | 3.0 | 4.0 | 0.8 | 0.0040 | 0.05 | — | — | — | — | — | — | — | 0.51 | 1.00 | ○ | ◎ | ○ | ○ | ○ | ○ |
| Example 25 | Bal. | 3.0 | 2.0 | 1.0 | 0.0040 | 0.03 | — | — | — | — | — | — | — | 0.67 | 2.00 | ○ | ○ | ○ | ○ | ○ | ○ |
| Example 26 | Bal. | 3.0 | 3.0 | 1.0 | 0.0040 | 0.03 | — | — | — | — | — | — | — | 0.57 | 1.33 | ○ | ◎ | ○ | ○ | ○ | ○ |
| Example 27 | Bal. | 3.0 | 4.0 | 1.0 | 0.0040 | 0.03 | — | — | — | — | — | — | — | 0.50 | 1.00 | ○ | ◎ | ○ | ○ | ○ | ○ |
| Example 28 | Bal. | 3.0 | 2.0 | 1.0 | 0.0040 | 0.05 | — | — | — | — | — | — | — | 0.67 | 2.00 | ○ | ○ | ○ | ○ | ○ | ○ |
| Example 29 | Bal. | 3.0 | 3.0 | 1.0 | 0.0040 | 0.05 | — | — | — | — | — | — | — | 0.57 | 1.33 | ○ | ○ | ○ | ○ | ○ | ○ |
| Example 30 | Bal. | 3.0 | 4.0 | 1.0 | 0.0040 | 0.05 | — | — | — | — | — | — | — | 0.50 | 1.00 | ○ | ◎ | ○ | ○ | ○ | ○ |
| Example 31 | Bal. | 3.0 | 3.0 | 1.0 | 0.0040 | — | 0.01 | — | — | — | — | — | — | 0.57 | 1.33 | ○ | ○ | ○ | ○ | ○ | ○ |
| Example 32 | Bal. | 3.0 | 3.0 | 1.0 | 0.0040 | — | — | 0.005 | — | — | — | — | — | 0.57 | 1.33 | ○ | ◎ | ○ | ○ | ○ | ○ |
| Example 33 | Bal. | 3.0 | 3.0 | 1.0 | 0.0040 | — | — | — | 0.0002 | — | — | — | — | 0.57 | 1.33 | ○ | ◎ | ○ | ○ | ○ | ○ |
| Example 34 | Bal. | 3.0 | 3.0 | 1.0 | 0.0040 | — | — | — | — | 0.01 | — | — | — | 0.57 | 1.33 | ○ | ◎ | ○ | ○ | ○ | ○ |
| Example 35 | Bal. | 3.0 | 3.0 | 1.0 | 0.0040 | — | — | — | 0.015 | — | — | — | — | 0.57 | 1.33 | ○ | ◎ | ○ | ○ | ○ | ○ |
| Example 36 | Bal. | 3.0 | 3.0 | 1.0 | 0.0040 | — | — | — | — | — | 0.005 | — | — | 0.57 | 1.33 | ○ | ◎ | ○ | ○ | ○ | ○ |
| Example 37 | Bal. | 3.0 | 3.0 | 1.0 | 0.0040 | — | — | — | — | — | — | 0.8 | — | 0.57 | 1.33 | ○ | ◎ | ○ | ○ | ○ | ○ |
| Example 38 | Bal. | 3.0 | 3.0 | 1.0 | 0.0040 | — | — | — | — | — | — | — | 0.2 | 0.57 | 1.33 | ○ | ○ | ○ | ○ | ○ | ○ |

TABLE 2

| | Sn | Ag | Bi | Cu | As | Ni | Co | Fe | P | Ga | Ge | In | Zn | 1,000 × As/(Ag + Cu + Bi) | 1,000 × As/Bi | As-concentrated surface layer | Heat cycle characteristics | Cu erosion | Thickening suppression of paste | Suppression of yellowing during heating solder piece | Comprehensive evaluation |
|---|---|---|---|---|---|---|---|---|---|---|---|---|---|---|---|---|---|---|---|---|---|
| Example 39 | Bal. | 3.3 | 1.5 | 0.9 | 0.0080 | — | — | — | — | — | — | — | — | 1.40 | 5.33 | ○ | ○ | ○ | ○ | ○ | ○ |
| Example 40 | Bal. | 3.3 | 2.0 | 0.9 | 0.0080 | — | — | — | — | — | — | — | — | 1.29 | 4.00 | ○ | ○ | ○ | ○ | ○ | ○ |
| Example 41 | Bal. | 3.3 | 2.5 | 0.9 | 0.0080 | — | — | — | — | — | — | — | — | 1.19 | 3.20 | ○ | ○ | ○ | ○ | ○ | ○ |
| Example 42 | Bal. | 3.3 | 3.0 | 0.9 | 0.0080 | — | — | — | — | — | — | — | — | 1.11 | 2.67 | ○ | ○○ | ○ | ○ | ○ | ○ |
| Example 43 | Bal. | 3.3 | 4.0 | 0.9 | 0.0080 | — | — | — | — | — | — | — | — | 0.98 | 2.00 | ○ | ○○ | ○ | ○ | ○ | ○ |
| Example 44 | Bal. | 3.3 | 5.0 | 0.9 | 0.0080 | — | — | — | — | — | — | — | — | 0.87 | 1.60 | ○ | ○○○ | ○ | ○ | ○ | ○ |
| Example 45 | Bal. | 3.3 | 6.0 | 0.9 | 0.0080 | — | — | — | — | — | — | — | — | 0.78 | 1.33 | ○ | ○○○ | ○ | ○ | ○ | ○ |
| Example 46 | Bal. | 3.5 | 1.5 | 0.8 | 0.0080 | — | — | — | — | — | — | — | — | 1.38 | 5.33 | ○ | ○ | ○ | ○ | ○ | ○ |
| Example 47 | Bal. | 3.5 | 2.0 | 0.8 | 0.0080 | — | — | — | — | — | — | — | — | 1.27 | 4.00 | ○ | ○ | ○ | ○ | ○ | ○ |
| Example 48 | Bal. | 3.5 | 3.0 | 0.8 | 0.0080 | — | — | — | — | — | — | — | — | 1.10 | 2.67 | ○ | ○○ | ○ | ○ | ○ | ○ |
| Example 49 | Bal. | 3.5 | 4.0 | 0.8 | 0.0080 | — | — | — | — | — | — | — | — | 0.96 | 2.00 | ○ | ○○ | ○ | ○ | ○ | ○ |
| Example 50 | Bal. | 3.5 | 4.5 | 0.8 | 0.0080 | — | — | — | — | — | — | — | — | 0.91 | 1.78 | ○ | ○○○ | ○ | ○ | ○ | ○ |
| Example 51 | Bal. | 4.0 | 1.5 | 1.1 | 0.0080 | — | — | — | — | — | — | — | — | 1.43 | 5.33 | ○ | ○ | ○ | ○ | ○ | ○ |
| Example 52 | Bal. | 4.0 | 1.5 | 1.0 | 0.0080 | — | — | — | — | — | — | — | — | 1.23 | 5.33 | ○ | ○ | ○ | ○ | ○ | ○ |
| Example 53 | Bal. | 3.0 | 4.0 | 1.1 | 0.0080 | — | — | — | — | — | — | — | — | 0.99 | 2.00 | ○ | ○○ | ○ | ○ | ○ | ○ |
| Example 54 | Bal. | 4.0 | 4.0 | 0.8 | 0.0080 | — | — | — | — | — | — | — | — | 0.89 | 2.00 | ○ | ○○ | ○ | ○ | ○ | ○ |
| Example 55 | Bal. | 4.0 | 5.0 | 1.1 | 0.0080 | — | — | — | — | — | — | — | — | 0.88 | 1.60 | ○ | ○○○ | ○ | ○ | ○ | ○ |
| Example 56 | Bal. | 4.0 | 5.0 | 1.2 | 0.0080 | — | — | — | — | — | — | — | — | 0.78 | 1.60 | ○ | ○○○ | ○ | ○ | ○ | ○ |
| Example 57 | Bal. | 3.0 | 2.0 | 0.8 | 0.0080 | 0.02 | — | — | — | — | — | — | — | 1.38 | 4.00 | ○ | ○ | ○ | ○ | ○ | ○ |
| Example 58 | Bal. | 3.0 | 3.0 | 0.8 | 0.0080 | 0.02 | — | — | — | — | — | — | — | 1.18 | 2.67 | ○ | ○○ | ○ | ○ | ○ | ○ |
| Example 59 | Bal. | 4.0 | 2.0 | 0.8 | 0.0080 | 0.02 | — | — | — | — | — | — | — | 1.03 | 2.00 | ○ | ○ | ○ | ○ | ○ | ○ |
| Example 60 | Bal. | 3.0 | 2.0 | 0.8 | 0.0080 | 0.05 | — | — | — | — | — | — | — | 1.38 | 4.00 | ○ | ○ | ○ | ○ | ○ | ○ |
| Example 61 | Bal. | 3.0 | 3.0 | 0.8 | 0.0080 | 0.05 | — | — | — | — | — | — | — | 1.18 | 2.67 | ○ | ○○ | ○ | ○ | ○ | ○ |
| Example 62 | Bal. | 3.0 | 4.0 | 0.8 | 0.0080 | 0.05 | — | — | — | — | — | — | — | 1.03 | 2.00 | ○ | ○○ | ○ | ○ | ○ | ○ |
| Example 63 | Bal. | 3.0 | 2.0 | 1.0 | 0.0080 | 0.03 | — | — | — | — | — | — | — | 1.33 | 4.00 | ○ | ○ | ○ | ○ | ○ | ○ |
| Example 64 | Bal. | 3.0 | 3.0 | 1.0 | 0.0080 | 0.03 | — | — | — | — | — | — | — | 1.14 | 2.67 | ○ | ○○ | ○ | ○ | ○ | ○ |
| Example 65 | Bal. | 3.0 | 4.0 | 1.0 | 0.0080 | 0.03 | — | — | — | — | — | — | — | 1.00 | 2.00 | ○ | ○○ | ○ | ○ | ○ | ○ |
| Example 66 | Bal. | 3.0 | 2.0 | 1.0 | 0.0080 | 0.05 | — | — | — | — | — | — | — | 1.33 | 4.00 | ○ | ○ | ○ | ○ | ○ | ○ |
| Example 67 | Bal. | 3.0 | 3.0 | 1.0 | 0.0080 | 0.05 | — | — | — | — | — | — | — | 1.14 | 2.67 | ○ | ○○ | ○ | ○ | ○ | ○ |
| Example 68 | Bal. | 3.0 | 4.0 | 1.0 | 0.0080 | 0.05 | — | — | — | — | — | — | — | 1.00 | 2.00 | ○ | ○○ | ○ | ○ | ○ | ○ |
| Example 69 | Bal. | 3.0 | 3.0 | 1.0 | 0.0080 | — | 0.01 | — | — | — | — | — | — | 1.14 | 2.67 | ○ | ○○ | ○ | ○ | ○ | ○ |
| Example 70 | Bal. | 3.0 | 3.0 | 1.0 | 0.0080 | — | — | 0.005 | — | — | — | — | — | 1.14 | 2.67 | ○ | ○○ | ○ | ○ | ○ | ○ |
| Example 71 | Bal. | 3.0 | 3.0 | 1.0 | 0.0080 | — | — | — | 0.0002 | — | — | — | — | 1.14 | 2.67 | ○ | ○○ | ○ | ○ | ○ | ○ |
| Example 72 | Bal. | 3.0 | 3.0 | 1.0 | 0.0080 | — | — | — | — | 0.01 | — | — | — | 1.14 | 2.67 | ○ | ○○ | ○ | ○ | ○ | ○ |
| Example 73 | Bal. | 3.0 | 3.0 | 1.0 | 0.0080 | — | — | — | 0.015 | — | — | — | — | 1.14 | 2.67 | ○ | ○○ | ○ | ○ | ○ | ○ |
| Example 74 | Bal. | 3.0 | 3.0 | 1.0 | 0.0080 | — | — | — | — | — | 0.005 | — | — | 1.14 | 2.67 | ○ | ○○ | ○ | ○ | ○ | ○ |
| Example 75 | Bal. | 3.0 | 3.0 | 1.0 | 0.0080 | — | — | — | — | — | — | 0.8 | — | 1.14 | 2.67 | ○ | ○○ | ○ | ○ | ○ | ○ |
| Example 76 | Bal. | 3.0 | 3.0 | 1.0 | 0.0080 | — | — | — | — | — | — | — | 0.2 | 1.14 | 2.67 | ○ | ○○ | ○ | ○ | ○ | ○ |

TABLE 3

| | Sn | Ag | Bi | Cu | As | Ni | Co | Fe | P | Ga | Ge | In | Zn | 1,000 × As/(Ag + Cu + Bi) | 1,000 × As/Bi | As-concentrated surface layer | Heat cycle characteristics | Cu erosion | Thickening suppression of paste | Suppression of yellowing during heating solder piece | Comprehensive evaluation |
|---|---|---|---|---|---|---|---|---|---|---|---|---|---|---|---|---|---|---|---|---|---|
| Example 77 | Bal. | 3.3 | 1.5 | 0.9 | 0.0150 | — | — | — | — | — | — | — | — | 2.63 | 10.00 | ○ | ○ | ○ | ○ | ○ | ○ |
| Example 78 | Bal. | 3.3 | 2.0 | 0.9 | 0.0150 | — | — | — | — | — | — | — | — | 2.42 | 7.50 | ○ | ○ | ○ | ○ | ○ | ○ |
| Example 79 | Bal. | 3.3 | 2.5 | 0.9 | 0.0150 | — | — | — | — | — | — | — | — | 2.24 | 6.00 | ○ | ○ | ○ | ○ | ○ | ○ |
| Example 80 | Bal. | 3.3 | 3.0 | 0.9 | 0.0150 | — | — | — | — | — | — | — | — | 2.08 | 5.00 | ○ | ○ | ○ | ○ | ○ | ○ |
| Example 81 | Bal. | 3.3 | 4.0 | 0.9 | 0.0150 | — | — | — | — | — | — | — | — | 1.83 | 3.75 | ○ | ○○ | ○ | ○ | ○ | ○ |
| Example 82 | Bal. | 3.3 | 5.0 | 0.9 | 0.0150 | — | — | — | — | — | — | — | — | 1.63 | 3.00 | ○ | ○○○ | ○ | ○ | ○ | ○ |
| Example 83 | Bal. | 3.3 | 6.0 | 0.9 | 0.0150 | — | — | — | — | — | — | — | — | 1.47 | 2.50 | ○ | ○○○ | ○ | ○ | ○ | ○ |
| Example 84 | Bal. | 3.5 | 1.5 | 0.8 | 0.0150 | — | — | — | — | — | — | — | — | 2.59 | 10.00 | ○ | ○ | ○ | ○ | ○ | ○ |
| Example 85 | Bal. | 3.5 | 2.0 | 0.8 | 0.0150 | — | — | — | — | — | — | — | — | 2.38 | 7.50 | ○ | ○ | ○ | ○ | ○ | ○ |
| Example 86 | Bal. | 3.5 | 3.0 | 0.8 | 0.0150 | — | — | — | — | — | — | — | — | 2.05 | 5.00 | ○ | ○ | ○ | ○ | ○ | ○ |
| Example 87 | Bal. | 3.5 | 4.0 | 0.8 | 0.0150 | — | — | — | — | — | — | — | — | 1.81 | 3.75 | ○ | ○○ | ○ | ○ | ○ | ○ |
| Example 88 | Bal. | 3.5 | 4.5 | 0.8 | 0.0150 | — | — | — | — | — | — | — | — | 1.70 | 3.33 | ○ | ○○ | ○ | ○ | ○ | ○ |
| Example 89 | Bal. | 3.5 | 1.5 | 1.1 | 0.0150 | — | — | — | — | — | — | — | — | 2.68 | 10.00 | ○ | ○ | ○ | ○ | ○ | ○ |
| Example 90 | Bal. | 4.0 | 1.5 | 1.1 | 0.0150 | — | — | — | — | — | — | — | — | 2.31 | 10.00 | ○ | ○ | ○ | ○ | ○ | ○ |
| Example 91 | Bal. | 3.0 | 4.0 | 1.1 | 0.0150 | — | — | — | — | — | — | — | — | 1.85 | 3.75 | ○ | ○○ | ○ | ○ | ○ | ○ |
| Example 92 | Bal. | 4.0 | 4.0 | 1.1 | 0.0150 | — | — | — | — | — | — | — | — | 1.67 | 3.75 | ○ | ○○ | ○ | ○ | ○ | ○ |
| Example 93 | Bal. | 4.0 | 5.0 | 1.1 | 0.0150 | — | — | — | — | — | — | — | — | 1.65 | 3.00 | ○ | ○○○ | ○ | ○ | ○ | ○ |
| Example 94 | Bal. | 4.0 | 5.0 | 1.2 | 0.0150 | — | — | — | — | — | — | — | — | 1.47 | 3.00 | ○ | ○○○ | ○ | ○ | ○ | ○ |
| Example 95 | Bal. | 3.0 | 2.0 | 0.8 | 0.0150 | 0.02 | — | — | — | — | — | — | — | 2.59 | 7.50 | ○ | ○ | ○ | ○ | ○ | ○ |
| Example 96 | Bal. | 3.0 | 3.0 | 0.8 | 0.0150 | 0.02 | — | — | — | — | — | — | — | 2.21 | 5.00 | ○ | ○ | ○ | ○ | ○ | ○ |
| Example 97 | Bal. | 3.0 | 4.0 | 0.8 | 0.0150 | 0.02 | — | — | — | — | — | — | — | 1.92 | 3.75 | ○ | ○○ | ○ | ○ | ○ | ○ |
| Example 98 | Bal. | 3.0 | 2.0 | 0.8 | 0.0150 | 0.05 | — | — | — | — | — | — | — | 2.59 | 7.50 | ○ | ○ | ○ | ○ | ○ | ○ |
| Example 99 | Bal. | 3.0 | 3.0 | 0.8 | 0.0150 | 0.05 | — | — | — | — | — | — | — | 2.21 | 5.00 | ○ | ○ | ○ | ○ | ○ | ○ |
| Example 100 | Bal. | 3.0 | 4.0 | 0.8 | 0.0150 | 0.05 | — | — | — | — | — | — | — | 1.92 | 3.75 | ○ | ○○ | ○ | ○ | ○ | ○ |
| Example 101 | Bal. | 3.0 | 2.0 | 1.0 | 0.0150 | 0.03 | — | — | — | — | — | — | — | 2.50 | 7.50 | ○ | ○ | ○ | ○ | ○ | ○ |
| Example 102 | Bal. | 3.0 | 3.0 | 1.0 | 0.0150 | 0.03 | — | — | — | — | — | — | — | 2.14 | 5.00 | ○ | ○ | ○ | ○ | ○ | ○ |
| Example 103 | Bal. | 3.0 | 4.0 | 1.0 | 0.0150 | 0.03 | — | — | — | — | — | — | — | 1.88 | 3.75 | ○ | ○○ | ○ | ○ | ○ | ○ |
| Example 104 | Bal. | 3.0 | 2.0 | 1.0 | 0.0150 | 0.05 | — | — | — | — | — | — | — | 2.50 | 7.50 | ○ | ○ | ○ | ○ | ○ | ○ |
| Example 105 | Bal. | 3.0 | 3.0 | 1.0 | 0.0150 | 0.05 | — | — | — | — | — | — | — | 2.14 | 5.00 | ○ | ○ | ○ | ○ | ○ | ○ |
| Example 106 | Bal. | 3.0 | 4.0 | 1.0 | 0.0150 | 0.05 | — | — | — | — | — | — | — | 1.88 | 3.75 | ○ | ○○ | ○ | ○ | ○ | ○ |
| Example 107 | Bal. | 3.0 | 3.0 | 1.0 | 0.0150 | — | 0.01 | — | — | — | — | — | — | 2.14 | 5.00 | ○ | ○ | ○ | ○ | ○ | ○ |
| Example 108 | Bal. | 3.0 | 3.0 | 1.0 | 0.0150 | — | — | 0.005 | — | — | — | — | — | 2.14 | 5.00 | ○ | ○ | ○ | ○ | ○ | ○ |
| Example 109 | Bal. | 3.0 | 3.0 | 1.0 | 0.0150 | — | — | — | 0.0002 | — | — | — | — | 2.14 | 5.00 | ○ | ○ | ○ | ○ | ○ | ○ |
| Example 110 | Bal. | 3.0 | 3.0 | 1.0 | 0.0150 | — | — | — | 0.015 | — | — | — | — | 2.14 | 5.00 | ○ | ○ | ○ | ○ | ○ | ○ |
| Example 111 | Bal. | 3.0 | 3.0 | 1.0 | 0.0150 | — | — | — | — | 0.01 | — | — | — | 2.14 | 5.00 | ○ | ○ | ○ | ○ | ○ | ○ |
| Example 112 | Bal. | 3.0 | 3.0 | 1.0 | 0.0150 | — | — | — | — | — | 0.005 | — | — | 2.14 | 5.00 | ○ | ○ | ○ | ○ | ○ | ○ |
| Example 113 | Bal. | 3.0 | 3.0 | 1.0 | 0.0150 | — | — | — | — | — | — | 0.8 | — | 2.14 | 5.00 | ○ | ○ | ○ | ○ | ○ | ○ |
| Example 114 | Bal. | 3.0 | 3.0 | 1.0 | 0.0150 | — | — | — | — | — | — | — | 0.2 | 2.14 | 5.00 | ○ | ○ | ○ | ○ | ○ | ○ |

TABLE 4

| | Sn | Ag | Bi | Cu | As | Ni | Co | Fe | P | Ga | Ge | In | Zn | 1,000 × As/(Ag + Cu + Bi) | 1,000 × As/Bi | As-concentrated surface layer | Heat cycle characteristics | Cu erosion | Thickening suppression of paste | Suppression of yellowing during heating solder piece | Comprehensive evaluation |
|---|---|---|---|---|---|---|---|---|---|---|---|---|---|---|---|---|---|---|---|---|---|
| Example 115 | Bal. | 3.3 | 1.5 | 0.9 | 0.0250 | — | — | — | — | — | — | — | — | 4.39 | 16.67 | ○ | ○ | ○ | ○ | ○ | ○ |
| Example 116 | Bal. | 3.3 | 2.0 | 0.9 | 0.0250 | — | — | — | — | — | — | — | — | 4.03 | 12.50 | ○ | ○ | ○ | ○ | ○ | ○ |
| Example 117 | Bal. | 3.3 | 2.5 | 0.9 | 0.0250 | — | — | — | — | — | — | — | — | 3.73 | 10.00 | ○ | ○ | ○ | ○ | ○ | ○ |
| Example 118 | Bal. | 3.3 | 3.0 | 0.9 | 0.0250 | — | — | — | — | — | — | — | — | 3.47 | 8.33 | ○ | ○ | ○ | ○ | ○ | ○ |
| Example 119 | Bal. | 3.3 | 4.0 | 0.9 | 0.0250 | — | — | — | — | — | — | — | — | 3.05 | 6.25 | ○ | ○○○ | ○ | ○ | ○ | ○ |
| Example 120 | Bal. | 3.3 | 5.0 | 0.9 | 0.0250 | — | — | — | — | — | — | — | — | 2.72 | 5.00 | ○ | ○○○ | ○ | ○ | ○ | ○ |
| Example 121 | Bal. | 3.3 | 6.0 | 0.9 | 0.0250 | — | — | — | — | — | — | — | — | 2.45 | 4.17 | ○ | ○○○ | ○ | ○ | ○ | ○ |
| Example 122 | Bal. | 3.5 | 1.5 | 0.8 | 0.0250 | — | — | — | — | — | — | — | — | 4.31 | 16.67 | ○ | ○ | ○ | ○ | ○ | ○ |
| Example 123 | Bal. | 3.5 | 2.0 | 0.8 | 0.0250 | — | — | — | — | — | — | — | — | 3.97 | 12.50 | ○ | ○ | ○ | ○ | ○ | ○ |
| Example 124 | Bal. | 3.5 | 3.0 | 0.8 | 0.0250 | — | — | — | — | — | — | — | — | 3.42 | 8.33 | ○ | ○ | ○ | ○ | ○ | ○ |
| Example 125 | Bal. | 3.5 | 4.0 | 0.8 | 0.0250 | — | — | — | — | — | — | — | — | 3.01 | 6.25 | ○ | ○○ | ○ | ○ | ○ | ○ |
| Example 126 | Bal. | 3.5 | 4.5 | 0.8 | 0.0250 | — | — | — | — | — | — | — | — | 2.84 | 5.56 | ○ | ○○○ | ○ | ○ | ○ | ○ |
| Example 127 | Bal. | 4.0 | 1.5 | 1.1 | 0.0250 | — | — | — | — | — | — | — | — | 4.46 | 16.67 | ○ | ○ | ○ | ○ | ○ | ○ |
| Example 128 | Bal. | 4.0 | 2.0 | 1.0 | 0.0250 | — | — | — | — | — | — | — | — | 3.85 | 12.50 | ○ | ○ | ○ | ○ | ○ | ○ |
| Example 129 | Bal. | 4.0 | 3.0 | 1.1 | 0.0250 | — | — | — | — | — | — | — | — | 3.09 | 6.25 | ○ | ○ | ○ | ○ | ○ | ○ |
| Example 130 | Bal. | 4.0 | 4.0 | 1.0 | 0.0250 | — | — | — | — | — | — | — | — | 2.78 | 6.25 | ○ | ○○ | ○ | ○ | ○ | ○ |
| Example 131 | Bal. | 4.0 | 5.0 | 1.1 | 0.0250 | — | — | — | — | — | — | — | — | 2.75 | 5.00 | ○ | ○○ | ○ | ○ | ○ | ○ |
| Example 132 | Bal. | 4.0 | 5.0 | 1.2 | 0.0250 | — | — | — | — | — | — | — | — | 2.45 | 5.00 | ○ | ○○○ | ○ | ○ | ○ | ○ |
| Example 133 | Bal. | 3.0 | 2.0 | 0.8 | 0.0250 | 0.02 | — | — | — | — | — | — | — | 4.31 | 12.50 | ○ | ○ | ○ | ○ | ○ | ○ |
| Example 134 | Bal. | 3.0 | 3.0 | 0.8 | 0.0250 | 0.02 | — | — | — | — | — | — | — | 3.68 | 8.33 | ○ | ○○ | ○ | ○ | ○ | ○ |
| Example 135 | Bal. | 3.0 | 4.0 | 0.8 | 0.0250 | 0.02 | — | — | — | — | — | — | — | 3.21 | 6.25 | ○ | ○○ | ○ | ○ | ○ | ○ |
| Example 136 | Bal. | 3.0 | 2.0 | 0.8 | 0.0250 | 0.05 | — | — | — | — | — | — | — | 4.31 | 12.50 | ○ | ○ | ○ | ○ | ○ | ○ |
| Example 137 | Bal. | 3.0 | 3.0 | 0.8 | 0.0250 | 0.05 | — | — | — | — | — | — | — | 3.68 | 8.33 | ○ | ○○ | ○ | ○ | ○ | ○ |
| Example 138 | Bal. | 3.0 | 4.0 | 0.8 | 0.0250 | 0.05 | — | — | — | — | — | — | — | 3.21 | 6.25 | ○ | ○○ | ○ | ○ | ○ | ○ |
| Example 139 | Bal. | 3.0 | 2.0 | 1.0 | 0.0250 | 0.03 | — | — | — | — | — | — | — | 4.17 | 12.50 | ○ | ○ | ○ | ○ | ○ | ○ |
| Example 140 | Bal. | 3.0 | 3.0 | 1.0 | 0.0250 | 0.03 | — | — | — | — | — | — | — | 3.57 | 8.33 | ○ | ○○ | ○ | ○ | ○ | ○ |
| Example 141 | Bal. | 3.0 | 4.0 | 1.0 | 0.0250 | 0.03 | — | — | — | — | — | — | — | 3.13 | 6.25 | ○ | ○○ | ○ | ○ | ○ | ○ |
| Example 142 | Bal. | 3.0 | 2.0 | 1.0 | 0.0250 | 0.05 | — | — | — | — | — | — | — | 4.17 | 12.50 | ○ | ○ | ○ | ○ | ○ | ○ |
| Example 143 | Bal. | 3.0 | 3.0 | 1.0 | 0.0250 | 0.05 | — | — | — | — | — | — | — | 3.57 | 8.33 | ○ | ○○ | ○ | ○ | ○ | ○ |
| Example 144 | Bal. | 3.0 | 4.0 | 1.0 | 0.0250 | 0.05 | — | — | — | — | — | — | — | 3.13 | 6.25 | ○ | ○○ | ○ | ○ | ○ | ○ |
| Example 145 | Bal. | 3.0 | 3.0 | 1.0 | 0.0250 | — | 0.01 | — | — | — | — | — | — | 3.57 | 8.33 | ○ | ○○ | ○ | ○ | ○ | ○ |
| Example 146 | Bal. | 3.0 | 3.0 | 1.0 | 0.0250 | — | — | 0.005 | — | — | — | — | — | 3.57 | 8.33 | ○ | ○○ | ○ | ○ | ○ | ○ |
| Example 147 | Bal. | 3.0 | 3.0 | 1.0 | 0.0250 | — | — | — | 0.0002 | — | — | — | — | 3.57 | 8.33 | ○ | ○○ | ○ | ○ | ○ | ○ |
| Example 148 | Bal. | 3.0 | 3.0 | 1.0 | 0.0250 | — | — | — | 0.015 | — | — | — | — | 3.57 | 8.33 | ○ | ○○ | ○ | ○ | ○ | ○ |
| Example 149 | Bal. | 3.0 | 3.0 | 1.0 | 0.0250 | — | — | — | — | 0.01 | — | — | — | 3.57 | 8.33 | ○ | ○○ | ○ | ○ | ○ | ○ |
| Example 150 | Bal. | 3.0 | 3.0 | 1.0 | 0.0250 | — | — | — | — | — | 0.005 | — | — | 3.57 | 8.33 | ○ | ○○ | ○ | ○ | ○ | ○ |
| Example 151 | Bal. | 3.0 | 3.0 | 1.0 | 0.0250 | — | — | — | — | — | — | 0.8 | — | 3.57 | 8.33 | ○ | ○○ | ○ | ○ | ○ | ○ |
| Example 152 | Bal. | 3.0 | 3.0 | 1.0 | 0.0250 | — | — | — | — | — | — | — | 0.2 | 3.57 | 8.33 | ○ | ○○ | ○ | ○ | ○ | ○ |

TABLE 5

| | Sn | Ag | Bi | Cu | As | Ni | Co | Fe | P | Ga | Ge | In | Zn | 1,000 × As/(Ag + Cu + Bi) | 1,000 × As/Bi | As-concentrated surface layer | Heat cycle characteristics | Cu erosion | Thickening suppression of paste | Suppression of yellowing during heating solder piece | Comprehensive evaluation |
|---|---|---|---|---|---|---|---|---|---|---|---|---|---|---|---|---|---|---|---|---|---|
| Comparative Example 1 | Bal. | 3.0 | — | 0.5 | — | — | — | — | — | — | — | — | — | 0.00 | — | | X | X | X | X | X |
| Comparative Example 2 | Bal. | 3.0 | — | 0.8 | — | — | — | — | — | — | — | — | — | 0.00 | — | | X | ○ | X | X | X |
| Comparative Example 3 | Bal. | 3.0 | — | 1.0 | — | — | — | — | — | — | — | — | — | 0.00 | — | | X | ○ | X | X | X |
| Comparative Example 4 | Bal. | 3.0 | — | 1.2 | — | — | — | — | — | — | — | — | — | 0.00 | — | X | X | ○ | X | X | X |
| Comparative Example 5 | Bal. | 2.5 | 1.0 | 0.5 | — | — | — | — | — | — | — | — | — | 0.00 | 0.00 | X | X | X | X | X | X |
| Comparative Example 6 | Bal. | 2.8 | 1.0 | 0.5 | — | — | — | — | — | — | — | — | — | 0.00 | 0.00 | X | X | X | X | X | X |
| Comparative Example 7 | Bal. | 3.3 | 1.0 | 0.7 | — | — | — | — | — | — | — | — | — | 0.00 | 0.00 | X | X | ○ | X | X | X |
| Comparative Example 8 | Bal. | 3.3 | 1.0 | 1.0 | — | — | — | — | — | — | — | — | — | 0.00 | 0.00 | X | X | X | X | X | X |
| Comparative Example 9 | Bal. | 4.0 | 1.0 | — | — | — | — | — | — | — | — | — | — | 0.00 | 0.00 | X | X | X | X | X | X |
| Comparative Example 10 | Bal. | 2.5 | 1.5 | 0.5 | — | — | — | — | — | — | — | — | — | 0.00 | 0.00 | X | X | ○ | X | X | X |
| Comparative Example 11 | Bal. | 1.5 | 2.0 | 1.0 | — | — | — | — | — | — | — | — | — | 0.00 | 0.00 | X | X | X | X | X | X |
| Comparative Example 12 | Bal. | 2.5 | 2.0 | 0.5 | — | — | — | — | — | — | — | — | — | 0.00 | 0.00 | X | X | X | X | X | X |
| Comparative Example 13 | Bal. | 3.0 | 2.0 | — | — | — | — | — | — | — | — | — | — | 0.00 | 0.00 | X | X | X | X | X | X |
| Comparative Example 14 | Bal. | 3.0 | 2.0 | 0.5 | — | — | — | — | — | — | — | — | — | 0.00 | 0.00 | X | ○ | ○ | X | X | X |
| Comparative Example 15 | Bal. | 3.0 | 2.0 | 0.8 | — | — | — | — | — | — | — | — | — | 0.00 | 0.00 | X | X | X | X | X | X |
| Comparative Example 16 | Bal. | 3.5 | 2.0 | — | — | — | — | — | — | — | — | — | — | 0.00 | 0.00 | X | X | X | X | X | X |
| Comparative Example 17 | Bal. | 4.0 | 2.0 | — | — | — | — | — | — | — | — | — | — | 0.00 | 0.00 | X | X | X | X | X | X |
| Comparative Example 18 | Bal. | 3.0 | 3.0 | 0.7 | — | — | — | — | — | — | — | — | — | 0.00 | 0.00 | X | X | X | X | X | X |
| Comparative Example 19 | Bal. | 3.5 | 3.0 | — | — | — | — | — | — | — | — | — | — | 0.00 | 0.00 | X | X | X | X | X | X |
| Comparative Example 20 | Bal. | 4.0 | 3.0 | — | — | — | — | — | — | — | — | — | — | 0.00 | 0.00 | X | X | X | X | X | X |
| Comparative Example 21 | Bal. | 2.0 | 8.0 | — | — | — | — | — | — | — | — | — | — | 0.00 | 0.00 | X | X | ○ | X | X | X |
| Comparative Example 22 | Bal. | 3.3 | 1.5 | 0.9 | 0.0020 | — | — | — | — | — | — | — | — | 0.35 | 1.33 | X | ○ | ○ | X | X | X |
| Comparative Example 23 | Bal. | 3.0 | 3.0 | 1.0 | 0.0020 | 0.03 | — | — | — | — | — | — | — | 0.29 | 0.67 | X | ○ | ○ | X | X | X |

TABLE 5-continued

| | Sn | Ag | Bi | Cu | As | Ni | Co | Fe | P | Ga | Ge | In | Zn | 1,000 × As/(Ag + Cu + Bi) | 1,000 × As/Bi | As-concentrated surface layer | Heat cycle characteristics | Cu erosion | Thickening suppression of paste | Suppression of yellowing during heating solder piece | Comprehensive evaluation |
|---|---|---|---|---|---|---|---|---|---|---|---|---|---|---|---|---|---|---|---|---|---|
| Comparative Example 24 | Bal. | 3.0 | 4.0 | 1.0 | <u>0.0500</u> | — | — | — | — | — | — | — | — | 6.25 | 12.50 | ○ | — | — | ○ | ○ | X |
| Comparative Example 25 | Bal. | 3.3 | 1.5 | 0.9 | 0.0040 | — | — | — | — | — | — | — | — | 0.70 | 2.67 | X | ○ | ○ | X | X | X |
| Comparative Example 26 | Bal. | 3.0 | 3.0 | 1.0 | 0.0040 | 0.03 | — | — | — | — | — | — | — | 0.57 | 1.33 | X | ○ | ○ | X | X | X |

The underlines indicate that the numerical values are out of the ranges of the present invention.

As can be seen from the results shown in Tables 1 to 5, the solder alloys of the examples not only had excellent heat cycle characteristics but also did not generate Cu erosion and had an As-concentrated layer. Therefore, in the solder alloys, yellowish discoloration does not occur and at the same time the thickening is suppressed.

On the other hand, the solder alloys of the related-art examples which were said to have excellent heat cycle characteristics did not satisfy at least one of the heat cycle characteristics, the Cu erosion, the yellowish discoloration, and the suppression of thickening which were required for in-vehicle electronic circuits. In Comparative Examples 25 and 26, since no heat treatment was performed, no As-concentrated layer was formed. Therefore, neither the yellowing suppression effect nor the thickening suppression effect was exhibited.

In Comparative Example 24, since a solder joint could not be formed due to a large amount of As and deteriorated wettability, the heat cycle characteristics and the Cu erosion could not be evaluated.

What is claimed is:

1. A solder alloy having an alloy composition comprising, by mass %, 2.8% to 4% of Ag, 1.5% to 6% of Bi, 0.8% to 1.2% of Cu, 0.0040% to 0.025% of As, and a balance of Sn, the solder alloy comprising:
    an As-concentrated layer,
    wherein the presence of the As-concentrated layer is confirmed by determination criteria as below,
    wherein the As-concentrated layer is a region from an outermost surface of the solder alloy to a depth of $2 \times D1$ (nm) in terms of $SiO_2$, and
    wherein a thickness of the As-concentrated layer in terms of $SiO_2$ is 0.5 to 8.0 nm,
    wherein the Determination Criteria comprises:
        selecting an arbitrary area of 700 μm×300 μm in three samples, each sample having a size of 5.0 mm×5.0 mm;
        performing an XPS analysis in combination with ion sputtering for each of three samples, for a total of three analyses where S1>S2 in all of the three analyses indicates that an As-concentrated layer has been formed, and where
        S1 is Integrated value of a detection intensity of As in a region from a depth of 0 to $2 \times D1$ (nm) in terms of $SiO_2$ in a chart of XPS analysis;
        S2 is Integrated value of a detection intensity of As in a region from a depth of $2 \times D1$ to $4 \times D1$ (nm) in terms of $SiO_2$ in a chart of XPS analysis;
        D1 is Initial depth (nm) in terms of $SiO_2$ at which a detection intensity of O atoms is ½ a maximum detection intensity (intensity at Do·max) in a portion deeper than the depth (Do·max (nm)) in terms of $SiO_2$ at which a detection intensity of O atoms is a maximum in a chart of XPS analysis, and the depth in terms of $SiO_2$ is calculated from the sputtering time using a sputter-etching rate of an $SiO_2$ standard sample.

2. The solder alloy according to claim 1,
    wherein the alloy composition further satisfies Expressions (1) and (2) below $$0.39 \leq 1{,}000 \times As/(Ag+Cu+Bi) \leq 0.71 \quad (1)$$

$$0.67 \leq 1{,}000 \times As/Bi \leq 2.67 \quad (2)$$

in Expressions (1) and (2), As, Ag, Cu, and Bi each represent a content (mass %) in the solder alloy.

3. The solder alloy according to claim 1, further comprising:
    a precipitate-recoverable solid solution structure.

4. The solder alloy according to claim 1,
    wherein the alloy composition further includes, by mass %, at least one of Ni, Fe, and Co in a total amount of 0.005% to 0.05%.

5. The solder alloy according to claim 1,
    wherein the alloy composition further includes, by mass %, 0.02% to 0.04% of Ni.

6. The solder alloy according to claim 1,
    wherein the alloy composition further includes, by mass %, at least one of P, Ge, and Ga in a total amount of 0.0002% to 0.02%.

7. The solder alloy according to claim 1,
    wherein the alloy composition further includes, by mass %, less than or equal to 1% of In.

8. The solder alloy according to claim 1,
    wherein the alloy composition further includes, by mass %, less than or equal to 1% of Zn.

9. The solder alloy according to claim 1 which is used in a power module.

10. A solder paste comprising:
    a solder powder consisting of the solder alloy according to claim 1, and a flux.

11. A solder ball consisting of the solder alloy according to claim 1.

12. A solder preform consisting of the solder alloy according to claim 1.

13. A solder joint made of the solder alloy according to claim 1.

14. A circuit comprising:
    the solder joint according to claim 13.

15. The solder alloy according to claim 1,
    wherein the solder alloy comprises more than 2.0% and 6% or less of Bi.

16. The solder alloy according to claim 1,
    wherein the solder alloy comprises more than 1.0% and 1.2% or less of Cu.

* * * * *